(12) United States Patent
Kobayashi

(10) Patent No.: US 10,944,933 B2
(45) Date of Patent: Mar. 9, 2021

(54) PHOTOELECTRIC CONVERSION APPARATUS, IMAGING SYSTEM, AND MOVING BODY

(71) Applicant: CANON KABUSHIKI KAISHA, Tokyo (JP)

(72) Inventor: Masahiro Kobayashi, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/267,098

(22) Filed: Feb. 4, 2019

(65) Prior Publication Data

US 2019/0253657 A1  Aug. 15, 2019

(30) Foreign Application Priority Data

Feb. 9, 2018 (JP) .............................. JP2018-022401

(51) Int. Cl.
*H04N 5/3745* (2011.01)
*H01L 27/146* (2006.01)
*H04N 5/378* (2011.01)
*H04N 5/369* (2011.01)

(52) U.S. Cl.
CPC ..... *H04N 5/37455* (2013.01); *H01L 27/1461* (2013.01); *H01L 27/14634* (2013.01); *H04N 5/378* (2013.01); *H04N 5/379* (2018.08); *H04N 5/37457* (2013.01)

(58) Field of Classification Search
CPC .... H04N 5/37455; H04N 5/378; H04N 5/379; H04N 5/37457; H01L 27/14634; H01L 27/1461
See application file for complete search history.

(56) References Cited

U.S. PATENT DOCUMENTS

| | | | |
|---|---|---|---|
| 8,773,562 B1* | 7/2014 | Fan | H01L 27/14641 348/308 |
| 9,654,714 B2* | 5/2017 | He | H04N 5/37457 |
| 9,749,569 B2* | 8/2017 | Mabuchi | H04N 5/378 |
| 10,218,922 B2* | 2/2019 | Kondo | H04N 5/345 |

(Continued)

FOREIGN PATENT DOCUMENTS

WO    2016/009832 A1    1/2016

*Primary Examiner* — Shabaz Nazrul
(74) *Attorney, Agent, or Firm* — Canon U.S.A., Inc. IP Division

(57) ABSTRACT

A photoelectric conversion apparatus according to an exemplary embodiment includes a plurality of pixels each including a photoelectric conversion unit, a transistor configured to process a signal charge generated in the photoelectric conversion unit, and an analog-to-digital conversion circuit. The apparatus further includes a first semiconductor substrate on which the photoelectric conversion units and the transistors of the plurality of pixels are two-dimensionally arranged, a second semiconductor substrate on which a plurality of circuit blocks is two-dimensionally arranged, a bonding portion configured to electrically connect the first semiconductor substrate and the second semiconductor substrate, and a wiring arranged between the first semiconductor substrate and the bonding portion. The wiring is connected to the transistors of the plurality of pixels and configured to supply a control signal to the transistors of the plurality of pixels.

28 Claims, 23 Drawing Sheets

(56) References Cited

U.S. PATENT DOCUMENTS

| | | | |
|---|---|---|---|
| 2009/0294813 A1* | 12/2009 | Gambino | H01L 27/14632 257/292 |
| 2010/0019130 A1* | 1/2010 | Lee | H01L 27/14634 250/208.1 |
| 2010/0258890 A1* | 10/2010 | Ahn | H01L 27/14636 257/432 |
| 2010/0276572 A1* | 11/2010 | Iwabuchi | H01L 23/481 250/208.1 |
| 2011/0156195 A1* | 6/2011 | Tivarus | H01L 27/14634 257/443 |
| 2011/0157445 A1* | 6/2011 | Itonaga | H01L 21/76898 348/308 |
| 2012/0217374 A1* | 8/2012 | Nishizawa | H01L 27/14618 250/208.1 |
| 2013/0308027 A1* | 11/2013 | Jenkin | H04N 5/347 348/302 |
| 2014/0104469 A1* | 4/2014 | Kim | H04N 5/335 348/297 |
| 2014/0320718 A1* | 10/2014 | Fan | H01L 27/14641 348/308 |
| 2015/0124135 A1* | 5/2015 | He | H04N 5/341 348/301 |
| 2016/0360138 A1* | 12/2016 | Meynants | H01L 27/14609 |
| 2017/0077168 A1* | 3/2017 | Wan | H01L 27/14629 |
| 2019/0074315 A1* | 3/2019 | Yasu | H04N 5/378 |

\* cited by examiner

PHOTOELECTRIC CONVERSION APPARATUS, IMAGING SYSTEM, AND MOVING BODY

BACKGROUND

Field of the Disclosure

The present disclosure relates to a photoelectric conversion apparatus, an imaging system, and a moving body.

Description of the Related Art

A photoelectric conversion apparatus, or a photoelectric conversion apparatus used for imaging or machine vision in particular, includes a plurality of pixels. PCT Application No. WO/2016/009832 discusses pixels each including a photoelectric conversion unit and transistors that receive a signal based on a charge generated in the photoelectric conversion unit and constitute a differential pair. As discussed in PCT Application No. WO/2016/009832, circuits included in a pixel can be divided and arranged on a plurality of semiconductor substrates.

SUMMARY

According to an aspect of the present disclosure, a photoelectric conversion apparatus includes a plurality of pixels each including a photoelectric conversion unit, a transistor configured to process a signal charge generated in the photoelectric conversion unit, and an analog-to-digital conversion circuit. The photoelectric conversion apparatus includes a first semiconductor substrate on which the photoelectric conversion units and the transistors of the plurality of pixels are two-dimensionally arranged, a second semiconductor substrate on which a plurality of circuit blocks is two-dimensionally arranged, a bonding portion configured to electrically connect the first semiconductor substrate and the second semiconductor substrate, and a wiring arranged between the first semiconductor substrate and the bonding portion. The wiring is connected to the transistors of the plurality of pixels and configured to supply a control signal to the transistors of the plurality of pixels.

According to another aspect of the present disclosure, a photoelectric conversion apparatus includes a plurality of pixels each including a photoelectric conversion unit, a transistor configured to process a signal charge generated in the photoelectric conversion unit, and an analog-to-digital conversion circuit. The photoelectric conversion apparatus includes a first semiconductor substrate on which the photoelectric conversion units and the transistors of the plurality of pixels are two-dimensionally arranged, a second semiconductor substrate on which a plurality of circuit blocks is two-dimensionally arranged, and a plurality of bonding portions configured to electrically connect the first semiconductor substrate and the second semiconductor substrate. Each of the plurality of bonding portions electrically connects a corresponding one of the plurality of circuit blocks and the transistor of a corresponding one of the plurality of pixels.

According to yet another aspect of the present disclosure, a photoelectric conversion apparatus includes a plurality of pixels each including a photoelectric conversion unit, a charge holding unit configured to hold a signal charge generated in the photoelectric conversion unit, an amplification transistor configured to output a signal based on the signal charge transferred from the charge holding unit, and a transistor configured to process the signal charge. The photoelectric conversion apparatus includes a first semiconductor substrate on which a first portion of each of the plurality of pixels is arranged, a second semiconductor substrates on which a second portion of each of the plurality of pixels is arranged, a plurality of bonding portions configured to electrically connect the first semiconductor substrate and the second semiconductor substrate, and a wiring arranged between the first semiconductor substrate and the bonding portions. The wiring is connected to the transistors of the plurality of pixels and configured to supply a control signal to the transistors of the plurality of pixels.

Further features of the present disclosure will become apparent from the following description of exemplary embodiments with reference to the attached drawings.

DESCRIPTION OF THE EMBODIMENTS

In several exemplary embodiments, the accuracy of signals output from a photoelectric conversion apparatus can be improved. PCT Application No. WO/2016/009832 includes no discussion about the arrangement of wirings for controlling transistors of pixels. In particular, if circuits included in each pixel are divided and arranged on a plurality of semiconductor substrates, the parasitic capacitances of wirings vary greatly depending on the arrangement of the wirings. The parasitic capacitances cause a delay in control signals, and the transistors of a plurality of pixels can fail to operate in synchronization with one another. This results, for example, in a drop in the image quality of an image captured by an imaging apparatus.

[Overall Configuration]

Figure 1:
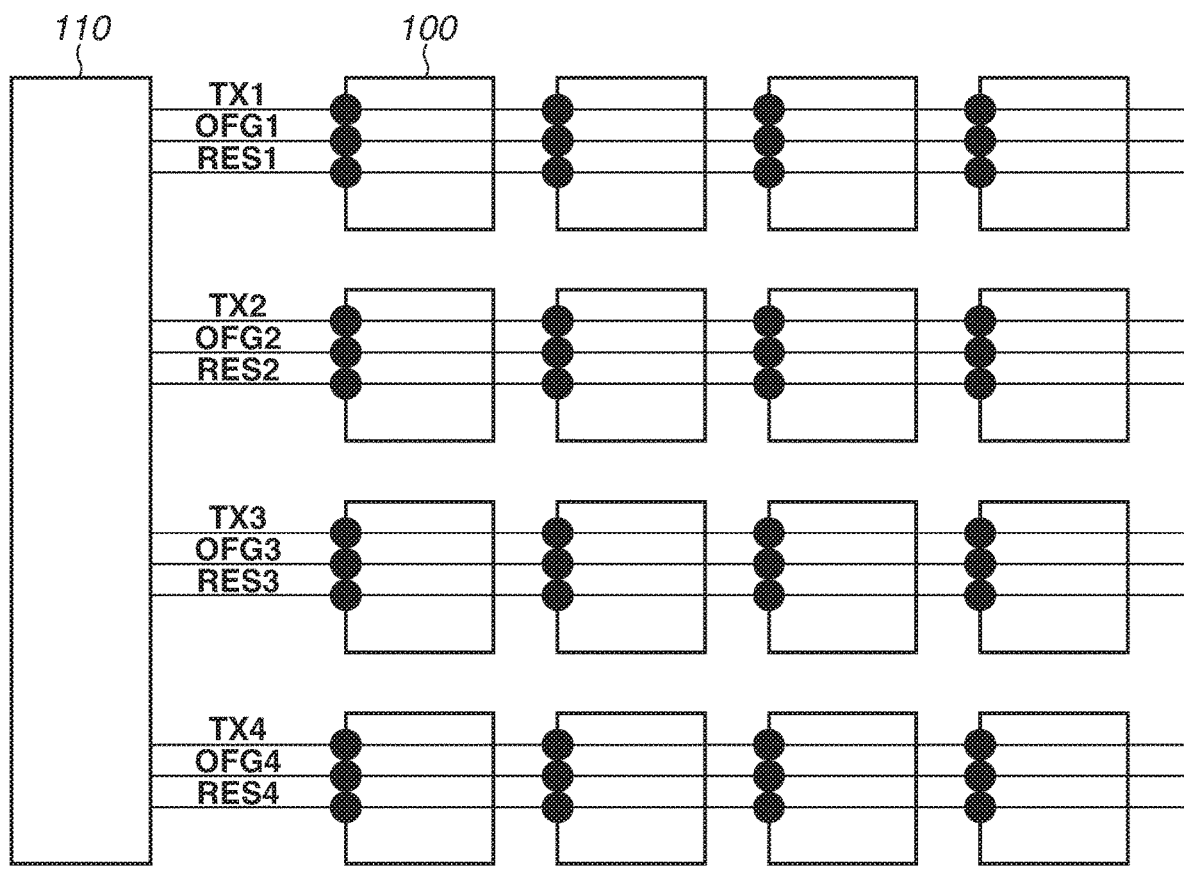
FIG. 1 is a diagram schematically illustrating a configuration of a photoelectric conversion apparatus.

A photoelectric conversion apparatus according to a first exemplary embodiment will be described. The photoelectric conversion apparatus is used as an imaging apparatus, for example. FIG. 1 schematically illustrates a configuration of the photoelectric conversion apparatus. The photoelectric conversion apparatus includes a plurality of pixels 100 and a reading circuit 110 for reading signals from the plurality of pixels 100.

The pixels 100 each include a photoelectric conversion unit and a pixel circuit. The photoelectric conversion unit converts incident light into a signal charge. A photodiode formed on a silicon substrate or an organic photoelectric conversion film stacked on a semiconductor substrate is used as the photoelectric conversion unit. The pixel circuit is a circuit for outputting signals based on charges generated in the photoelectric conversion unit from the pixel. The pixel circuit according to the present exemplary embodiment includes an analog-to-digital conversion circuit (hereinafter, ADC circuit). The ADC circuit typically includes a comparator including a differential pair. In other words, the pixel circuit according to the present exemplary embodiment includes transistors constituting a differential pair.

The reading circuit 110 is a scanning circuit that supplies control signals (TX1 to TX4, OFG1 to OFG4, and RES1 to RES4) to a plurality of control wirings connected to the pixels 100. The pixels 100 operate based on the control signals, whereby signals based on charges generated in the photoelectric conversion units are output from the pixels 100. The reading circuit 110 may be a signal processing circuit that processes the signals output from the pixels 100.

[Pixel Configuration]

Figure 2:
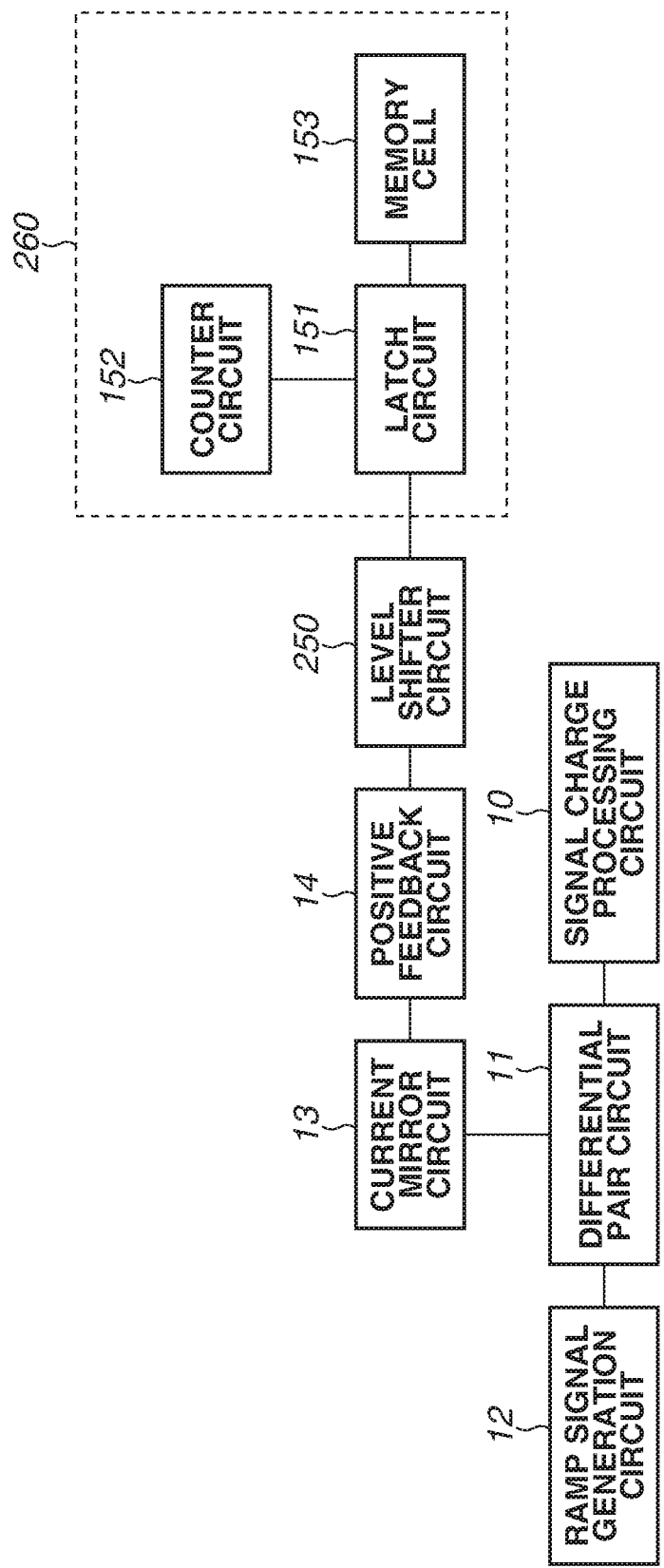
FIG. 2 is a block diagram schematically illustrating a configuration of a pixel of the photoelectric conversion apparatus.

FIG. 2 is a block diagram schematically illustrating a configuration of a pixel 100. The pixel circuit of the pixel 100 functionally includes a plurality of circuit blocks. A signal charge processing circuit 10 accumulates, transfers, and discharges signal charge generated in the photoelectric conversion unit. A differential pair circuit 11 includes transistors constituting a differential pair, and a current source that supplies current to the differential pair. A ramp signal generation circuit 12 supplies a ramp signal to the ADC circuit. A current mirror circuit 13 controls the current flowing through the differential pair circuit 11. The differential pair circuit 11 and the current mirror circuit 13 constitute the comparator of the ADC circuit. The pixel circuit of the pixel 100 further includes a positive feedback circuit 14, a level shifter circuit 250, and a memory circuit 260. The positive feedback circuit 14 accelerates inversion of output of the comparator. In other words, the positive feedback circuit 14 generates a pulse that rises (or falls) more quickly in response to that the output of the comparator starts inverting. The level shifter circuit 250 reduces the amplitude of a latch signal output from the comparator via the positive feedback circuit 14. The memory circuit 260 stores a digital signal based on the latch signal output from the comparator. Typically, the differential pair circuit 11, the current mirror circuit 13, and the memory circuit 260 constitute the ADC circuit.

A plurality of pixels 100 may share the ramp signal generation circuit 12. In such a case, the ramp signal generation unit 12 is not included in the pixel circuits of the pixels 100.

[Pixel Circuit]

Figure 3:
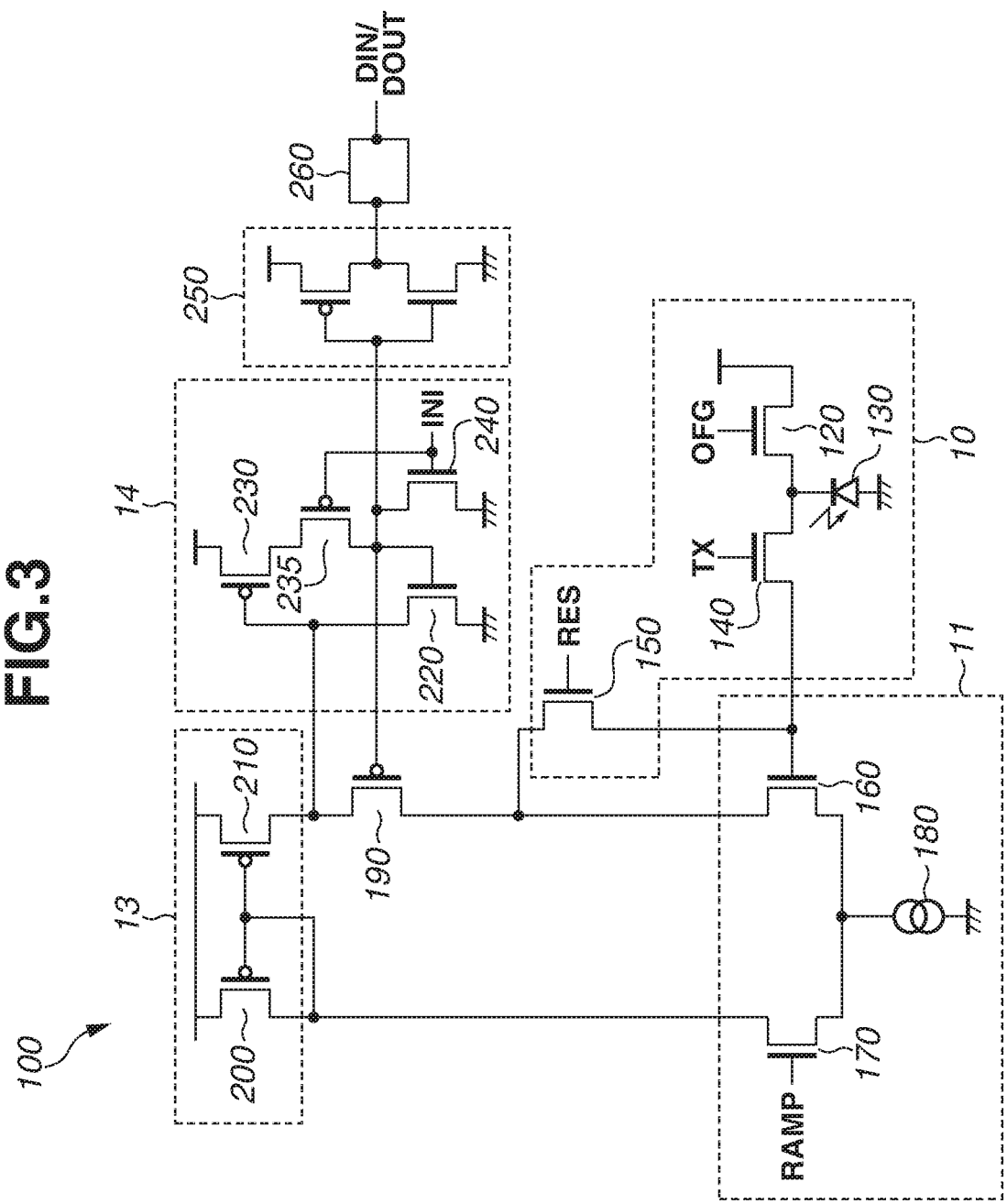
FIG. 3 is a diagram illustrating an equivalent circuit of the pixel of the photoelectric conversion apparatus.

A detailed configuration of the circuit blocks will be described. FIG. 3 is a diagram illustrating an equivalent circuit of a pixel 100. The memory circuit 260 is illustrated as a block. The ramp signal generation circuit 12 is provided for each pixel 100, for each row including a plurality of pixels 100, or for all the pixels 100 in common. The ramp signal generation circuit 12 is therefore not illustrated in FIG. 3.

The signal charge processing circuit 10 includes a discharging transistor 120, a transfer transistor 140, and a reset transistor 150. The discharging transistor 120, the transfer transistor 140, and the reset transistor 150 are N-channel metal-oxide-semiconductor (MOS) transistors. In the circuit diagram, a MOS transistor with an open circle on its gate represents a P-channel MOS transistor. A MOS transistor without an open circle on its gate represents an N-channel MOS transistor.

The discharging transistor 120 is connected to a photoelectric conversion unit 130. The discharging transistor 120 discharges a signal charge generated in the photoelectric conversion unit 130 based on a control signal OFG. The transfer transistor 140 is connected to the photoelectric conversion unit 130 and an input node of the differential pair circuit 11. The transfer transistor 140 transfers the signal charge generated in the photoelectric conversion unit 130 to the input node of the differential pair circuit 11 based on a control signal TX. The reset transistor 150 is connected to the input node of the differential pair circuit 11. The reset transistor 150 resets the voltage of the input node of the differential pair circuit 11 to an initial value based on a control signal RES. In the present exemplary embodiment, the drain of the reset transistor 150 is connected to the drain of an input transistor 160 of the differential pair circuit 11. In a modification of the present exemplary embodiment, the drain of the reset transistor 150 is connected to a node for supplying reset power.

The differential pair circuit 11 includes the input transistor 160 and a reference transistor 170. The input transistor 160 and the reference transistor 170 are N-channel MOS transistors. The source of the input transistor 160 and the source of the reference transistor 170 are connected to a current source 180 in common. The input transistor 160 and the reference transistor 170 thus connected constitute a differential pair. The input transistor 160 receives a signal based on the signal charge generated in the photoelectric conversion unit 130. More specifically, the gate of the input transistor 160 serves as an input node of the differential pair circuit 11. The not-illustrated ramp signal generation circuit 12 supplies the ramp signal to the gate of the reference transistor 170.

The current mirror circuit 13 includes a transistor 200 and a transistor 210. Both the transistors 200 and 210 are a P-channel MOS transistor. The gate of the transistor 200 and the gate of the transistor 210 are connected to each other. The drain of the transistor 200 is connected to the reference transistor 170. The drain of the transistor 210 is connected to the input transistor 160. The gate and drain of the transistor 200 are connected to each other.

With the connection illustrated in FIG. 3, the differential pair circuit 11 and the current mirror circuit 13 constitute the comparator. If a relationship in magnitude between the gate potential of the input transistor 160 and the gate potential of the reference transistor 170 is inverted, an output node of the comparator (drain of the transistor 210) changes in potential. If the gate potential of the input transistor 160 is higher than that of the reference transistor 170, the potential of the output node of the comparator is at a low level. On the other hand, if the gate potential of the input transistor 160 is lower than that of the reference transistor 170, the potential of the output node of the comparator is at a high level.

The ramp signal supplied by the ramp signal generation circuit 12 changes from a high voltage to a low voltage. The potential of the output node of the comparator therefore changes from the high level to the low level at some point in time. The time between when the ramp signal starts changing and when the potential of the output node of the comparator changes is thus determined based on the level of the gate potential of the input transistor 160, i.e., the level of the signal based on the charge generated in the photoelectric conversion unit 130. By counting the time, the signal based on the charge generated in the photoelectric conversion unit 130 can be converted into a digital signal.

If the reset transistor 150 is on, the differential pair circuit 11 and the current mirror circuit 13 function as a voltage follower circuit. The gate potential of the input transistor 160 can thus be reset to an arbitrary value based on the potential of the ramp signal.

The positive feedback circuit 14 includes four transistors 220, 230, 235, and 240. The transistors 220 and 240 are N-channel MOS transistors. The transistors 230 and 235 are P-channel MOS transistors.

The output node of the comparator is connected to the drain of the transistor 220 and the gate of the transistor 230. The source of the transistor 220 is grounded. The source of the transistor 230 is connected to a power supply node. The drain of the transistor 230 is connected to the gate of the transistor 220 via the transistor 235. The drain of the transistor 240 is connected to the gate of the transistor 220 and to the transistor 235. An initialization signal INI is supplied to the gate of the transistor 235 and the gate of the transistor 240. The node connected to the gate of the transistor 220 and the drain of the transistor 240 is an output node of the positive feedback circuit 14.

Functions of the positive feedback circuit 14 will be described. Before the positive feedback circuit 14 is put into operation, i.e., before start of analog-to-digital conversion (AD conversion), the initialization signal INI transitions from a high level to a low level. This turns on the transistor 235 and turns off the transistor 240. If the initial signal INI is at the high level, the transistor 240 is on and the output node of the positive feedback circuit 14 is thus low in potential (near ground potential).

When AD conversion is started, the potential of the ramp signal is higher than the gate potential of the input transistor 160 (the level of the signal based on the charge in the photoelectric conversion unit 130). The potential of the output node of the comparator (drain of the transistor 210) is therefore at a high level. The transistor 230 is thus off. Since the output node of the positive feedback circuit 14 (gate of the transistor 220) is near the ground potential as described above, the transistor 220 is off.

If the potential of the output node of the comparator changes from the high level to a low level, the voltage between the gate and source of the transistor 230 increases. This turns on the transistor 230. Since the power supply node up to the gate of the transistor 220 are conducting, the gate potential of the transistor 220 increases. The transistor 220 turns on, and a current occurs from the output node of the comparator to the ground node via the transistor 220. This accelerates the potential fall of the output node of the comparator. Since the potential fall of the output node of the comparator further increases the voltage between the gate and source of the transistor 230, the rise in the gate potential of the transistor 220 is accelerated. In such a manner, the change in the potential of the output node of the comparator is positively fed back by the positive feedback circuit 14. As a result, the potential of the output node of the positive feedback circuit 14 can be changed at high speed when the relationship in magnitude between the gate potential of the input transistor 160 and the gate potential (ramp signal) of the reference transistor 170 is inverted.

After the AD conversion is completed, the initialization signal INI transitions from the low level to the high level. The potential of the output node of the positive feedback circuit 14 is thereby reset to the ground potential. While the initial signal INI is at the high level, the transistor 235 is off. This can reduce a through current flowing from the power supply node to the ground node of the positive feedback circuit 14. Without the transistor 235, a through current based on the gate potential of the transistor 230 can flow. If limitation on power consumption is not severe, the transistor 235 may be omitted. If the transistor 235 is omitted, the drain of the transistor 230 is directly connected to the gate of the transistor 220. This enhances the acceleration effect of the positive feedback circuit 14.

In the present exemplary embodiment, the transistor 210 of the current mirror circuit 13 is connected to the input transistor 160 via a current limiting transistor 190. The current limiting transistor 190 is a P-channel MOS transistor. The gate of the current limiting transistor 190 is connected to the output of the positive feedback circuit 14.

Without the current limiting transistor 190, a large current continues to flow from the transistor 210 of the current mirror circuit 13 to the transistor 220 of the positive feedback circuit 14 after the output signal of the comparator is inverted.

The insertion of the current limiting transistor 190 between the transistor 210 and the input transistor 160 can limit the current flowing from the transistor 210 to the transistor 220 of the positive feedback circuit 14.

The positive feedback circuit 14 is provided according to need, and may be omitted. If the positive feedback circuit 14 is omitted, the output node of the comparator is connected to the level shifter circuit 250. If the positive feedback circuit 14 is omitted, the current limiting transistor 190 may also be omitted.

The signal of the output node of the comparator and the signal of the output node of the positive feedback circuit 14 are used as a latch signal. The memory circuit 260 stores a count value based the latch signal. The level shifter circuit 250 is used to transmit the latch signal to the memory circuit 260. The level shifter circuit 250 is an inverter circuit including an N-channel transistor and a P-channel transistor. The amplitude of the latch signal output from the level shifter circuit 250 changes depending on a power supply voltage supplied to the level shifter circuit 250. In the present exemplary embodiment, to operate digital circuits in subsequent stages at high speed, the level shifter circuit 250 reduces the amplitude of the latch signal. Specifically, the power supply voltage supplied to the level shifter circuit 250 is lower than the power supply voltage supplied to the comparator (the differential pair circuit 11 and the current mirror circuit 13) and the positive feedback circuit 14.

The level shifter circuit 250 is provided according to need, and may be omitted. If the level shifter circuit 250 is omitted, the output node of the positive feedback circuit 14 is connected to the memory circuit 260. Alternatively, the level shifter circuit 250 may provide only a waveform-shaping function of an inverter circuit. In such a case, the level shifter circuit 250 does not change the amplitude of the latch signal.

Next, a configuration of the memory circuit 260 will be described with reference to FIG. 2. The memory circuit 260 includes a latch circuit 151, a counter circuit 152, and a memory cell 153. The counter circuit 152 outputs an N-bit count signal. A plurality of latch circuits 151 is provided based on the number of bits. The latch circuits 151 are connected to output wirings of respective bits of the counter circuit 152. A plurality of memory cells 153 is provided based on the number of bits. The memory cells 153 are connected to the output nodes of the latch circuits 151. The latch circuit 151 holds the count signal output from the counter circuit 152 based on the latch signal. The signal held in the latch circuit 151 is transferred to the memory cell 153 based on a transfer signal.

[Stacking of Two Semiconductor Substrates]

Figure 4:
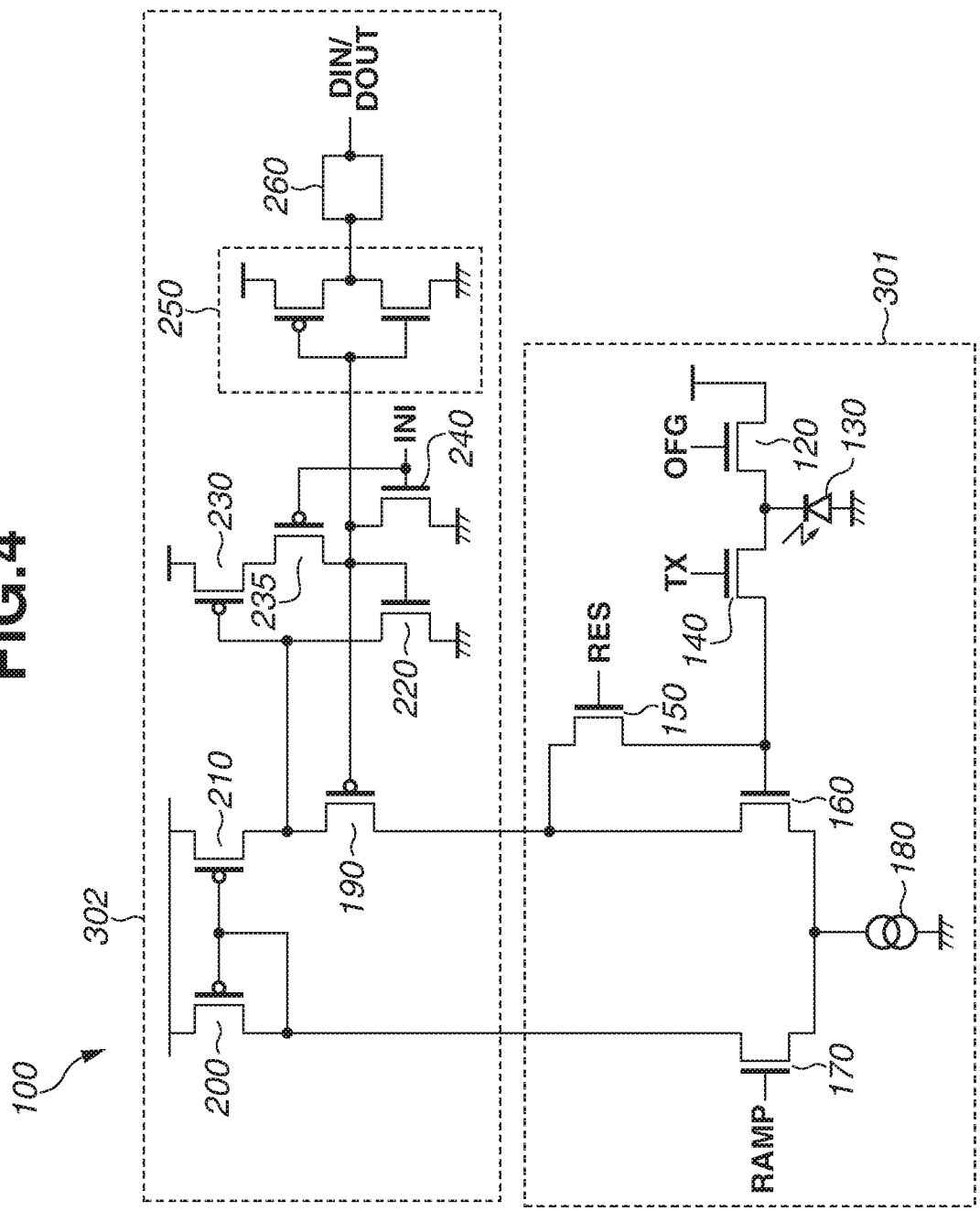
FIG. 4 is a diagram illustrating an equivalent circuit of the pixel of the photoelectric conversion apparatus.

In the photoelectric conversion apparatus according to the present exemplary embodiment, the pixel circuit of a pixel 100 is divided and arranged on two semiconductor substrates (a first semiconductor substrate 301 and a second semiconductor substrate 302). Like FIG. 3, FIG. 4 is a diagram illustrating the equivalent circuit of the pixel 100. In FIG. 4, the elements arranged on the first semiconductor substrate 301 and the elements arranged on the second semiconductor substrate 302 are distinguished by dotted lines.

Specifically, the photoelectric conversion unit 130 is arranged on the first semiconductor substrate 301. The signal charge processing circuit 10 including the discharging transistor 120, the transfer transistor 140, and the reset transistor 150 is arranged on the first semiconductor substrate 301. The differential pair circuit 11 including the input transistor 160, the reference transistor 170, and the current source 180 is arranged on the first semiconductor substrate 301.

The current mirror circuit 13 including the transistors 200 and 210 is arranged on the second semiconductor substrate 302. The positive feedback circuit 14 including the four transistors 220, 230, 235, and 240 is arranged on the second semiconductor substrate 302. The level sifter circuit 250 and the memory circuit 260 are arranged on the second semiconductor substrate 302. The reading circuit 110 in FIG. 1 and the ramp signal generation circuit 12 in FIG. 2 are both arranged on the second semiconductor substrate 302.

As described above, the pixel 100 includes the ADC circuit. The ADC circuit of the pixel 100 is divided and arranged on the two semiconductor substrates 301 and 302. Specifically, the differential pair circuit 11 of the ADC circuit is arranged on the first semiconductor substrate 301. The current mirror circuit 13 and the memory circuit 260 of the ADC circuit are arranged on the second semiconductor substrate 302.

Figure 5:
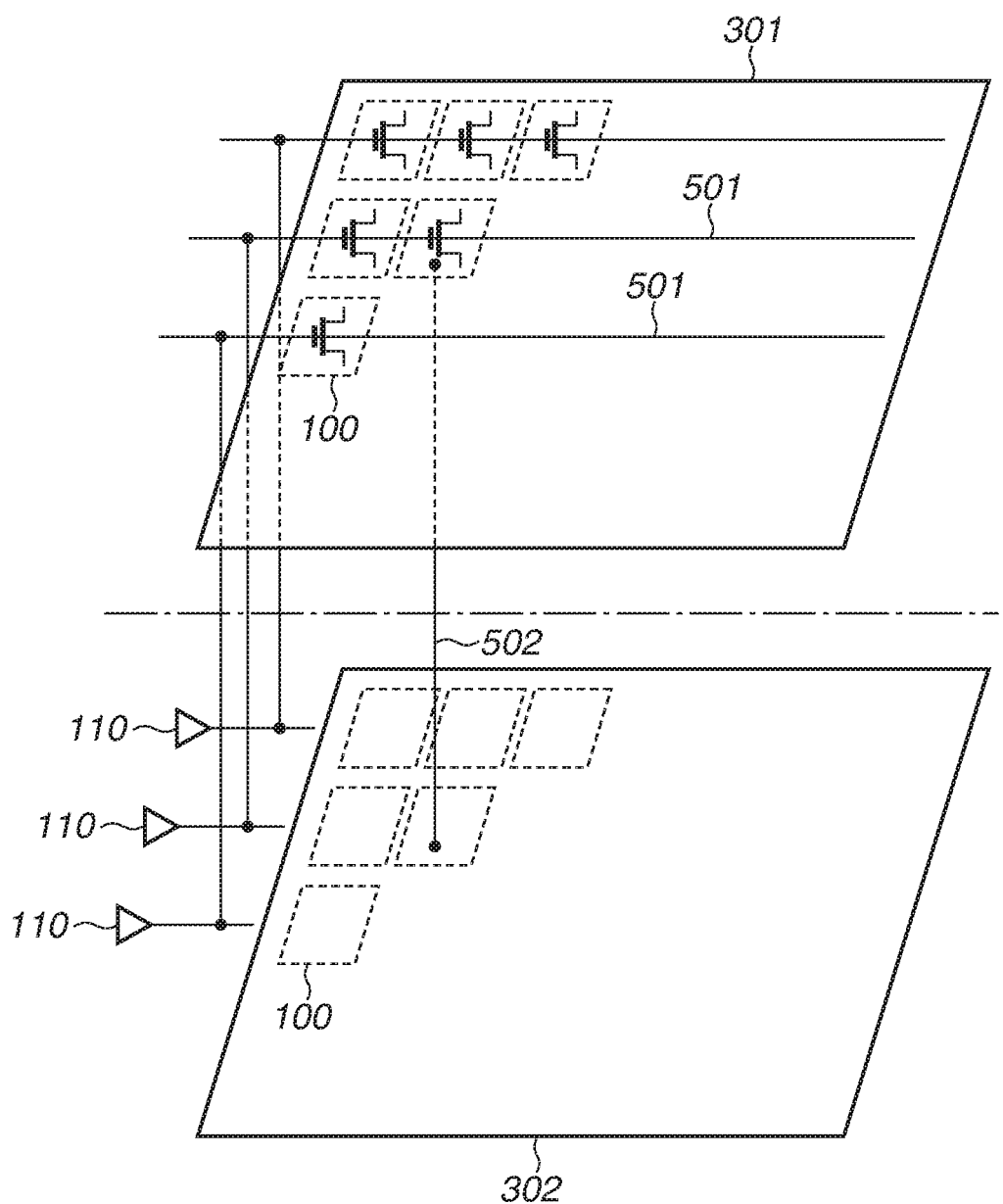
FIG. 5 is a diagram schematically illustrating an arrangement and connection of two semiconductor substrates.

A connection and arrangement of the two semiconductor substrates 301 and 302 will be described. FIG. 5 is a diagram schematically illustrating the arrangement and connection between the first semiconductor substrate 301 and the second semiconductor substrate 302. In the present exemplary embodiment, the first semiconductor substrate 301 including the photoelectric conversion units 130 and the second semiconductor substrate 302 including part of the pixel circuits are stacked on each other. When the photoelectric conversion units 130 are projected upon the second semiconductor substrate 302 in a direction perpendicular to the surface of the first semiconductor substrate 301, at least some of the transistors of the pixel circuits overlap with the projections of the photoelectric conversion units 130. Specifically, some or all of the transistors included in the current mirror circuits 13, the positive feedback circuits 14, the level shifter circuits 250, and the memory circuits 260 are arranged at positions overlapping with the projections of the photoelectric conversion units 130.

On the first semiconductor substrate 301, a plurality of pixel circuits each including a photoelectric conversion unit 130, a signal charge processing circuit 10, and a differential pair circuit 11 as a single unit is two-dimensionally arranged in a matrix. On the second semiconductor substrate 302, a plurality of pixel circuits each including a current mirror circuit 13, a positive feedback circuit 14, a level shifter circuit 250, and a memory circuit 260 as a single unit is two-dimensionally arranged in a matrix. To put it in a different perspective, first portions of the pixel circuits including the ADC circuits are two-dimensionally arranged in a matrix on the first semiconductor substrate 301. Second portions of the pixel circuits including the ADC circuits are two-dimensionally arranged in a matrix on the second semiconductor substrate 302.

Next, an arrangement of wirings for transmitting control signals for controlling the transistors of the pixel circuits and signals output from the pixels 100 will be described. FIG. 5 illustrates control wirings 501 connected to the transistors arranged on the first semiconductor substrate 301. The control wirings 501 are connected to the gates of the discharging transistors 120, the transfer transistors 140, and the reset transistors 150. In other words, the control wirings 501 supply the control signals TX, the control signals OFG, and the control signals RES of FIG. 1. As illustrated in FIG. 5, the control wirings 501 are connected to the transistors of a plurality of pixels 100 in common.

FIG. 5 also illustrates a connection wiring 502 that connects a transistor arranged on the first semiconductor substrate 301 and a transistor arranged on the second semiconductor substrate 302 inside a pixel 100. Examples of the connection wiring 502 include a wiring connecting the input transistor 160 and the current limiting transistor 190 in FIG. 4, and a wiring connecting the reference transistor 170 and the transistor 200.

The dot-dashed line passing between the first semiconductor substrate 301 and the second semiconductor substrate 302 represents bonding portions of wirings. The control wirings 501 and the connection wiring 502 are both connected to the bonding portions. The bonding portions are is formed by at least two wiring layers. In manufacturing the photoelectric conversion apparatus, at least one wiring layer is formed on each of the first and second semiconductor substrates 301 and 302. Conductive members included in the topmost wiring layer among the wiring layers of the first semiconductor substrate 301 are then bonded to conductive members included in the topmost wiring layer among the wiring layers of the second semiconductor substrate 302. In such a manner, the first semiconductor substrate 301 and the second semiconductor substrate 302 are stacked on each other. The conductive member are suitably formed of copper or a copper-containing alloy.

In view of the foregoing processes for stacking the two semiconductor substrates, the wirings arranged between the bonding portions and the first semiconductor substrate 301 will be referred to, for the sake of convenience, as wirings arranged on the first semiconductor substrate 301 or wirings of the first semiconductor substrate 301. The wirings of the first semiconductor substrate 301 are typically formed on the first semiconductor substrate 301 before the foregoing joining process. Similarly, the wirings arranged between the bonding portions and the second semiconductor substrate 302 will be referred to, for the sake of convenience, as wirings arranged on the second semiconductor substrate 302 or wirings of the second semiconductor substrate 302. The wirings of the second semiconductor substrate 302 are typically formed on the second semiconductor substrate 302 before the foregoing joining process.

In general, a bonding portion can have a high parasitic capacitance. As the number of bonding portions connected to a wiring increases, the parasitic capacitance of the wiring can increase. In the present exemplary embodiment, the signal paths for supplying the control signals from the reading circuit 110 arranged on the second semiconductor substrate 302 to the transistors of the pixels 100 arranged on the first semiconductor substrate 301 include bonding portions. In other words, the control wirings 501 for transmitting the control signals are connected to the bonding portions. As the parasitic capacitance of the control wiring 501 increase, issues such as delayed supply of the control signal and deformation of the waveforms of the control signal can occur.

To address such issues, the control wirings 501 according to the present exemplary embodiment are arranged on the first semiconductor substrate 301. In other words, the control wirings 501 are arranged between the bonding portions and the first semiconductor substrate 301. The control wirings 501 are then connected to the transistors (discharging transistors 120, transfer transistors 140, and reset transistors 150) of a plurality of pixels 100 in common. That is, the control wirings 501 supply the control signals TX, the control signals OFG, and the control signals RES of FIG. 1 to the plurality of pixels 100. The number of bonding portions used to connect the control wirings 501 to the reading circuit 110 arranged on the second semiconductor substrate 302 can therefore be reduced. Such a configuration can reduce the parasitic capacitance of the control wiring 501. The delay of supply of the control signal and the deformation of the waveform of the control signal can thus be reduced. As a result, the accuracy of the signals output from the photoelectric conversion apparatus can be improved.

For the sake of simplicity, in FIG. 5, a plurality of control wirings 501 connected to a row of pixels 100 is represented by a single line. In other words, control wirings 501 connected to discharging transistors 120, control wirings 501 connected to transfer transistors 140, and control wirings 501 connected to reset transistors 150 are individually arranged on the first semiconductor substrate 301. It is preferably that two control wirings thus connected to two respective transistors arranged on the same substrate is arranged on the same semiconductor substrate. Such a configuration can reduce a difference between the parasitic capacitances of the two control wirings. As a result, the operation synchronicity of the pixel circuits of the pixels 100 improves, whereby the accuracy of the signals output from the photoelectric conversion apparatus can be improved.

[Operation]

Figure 6:
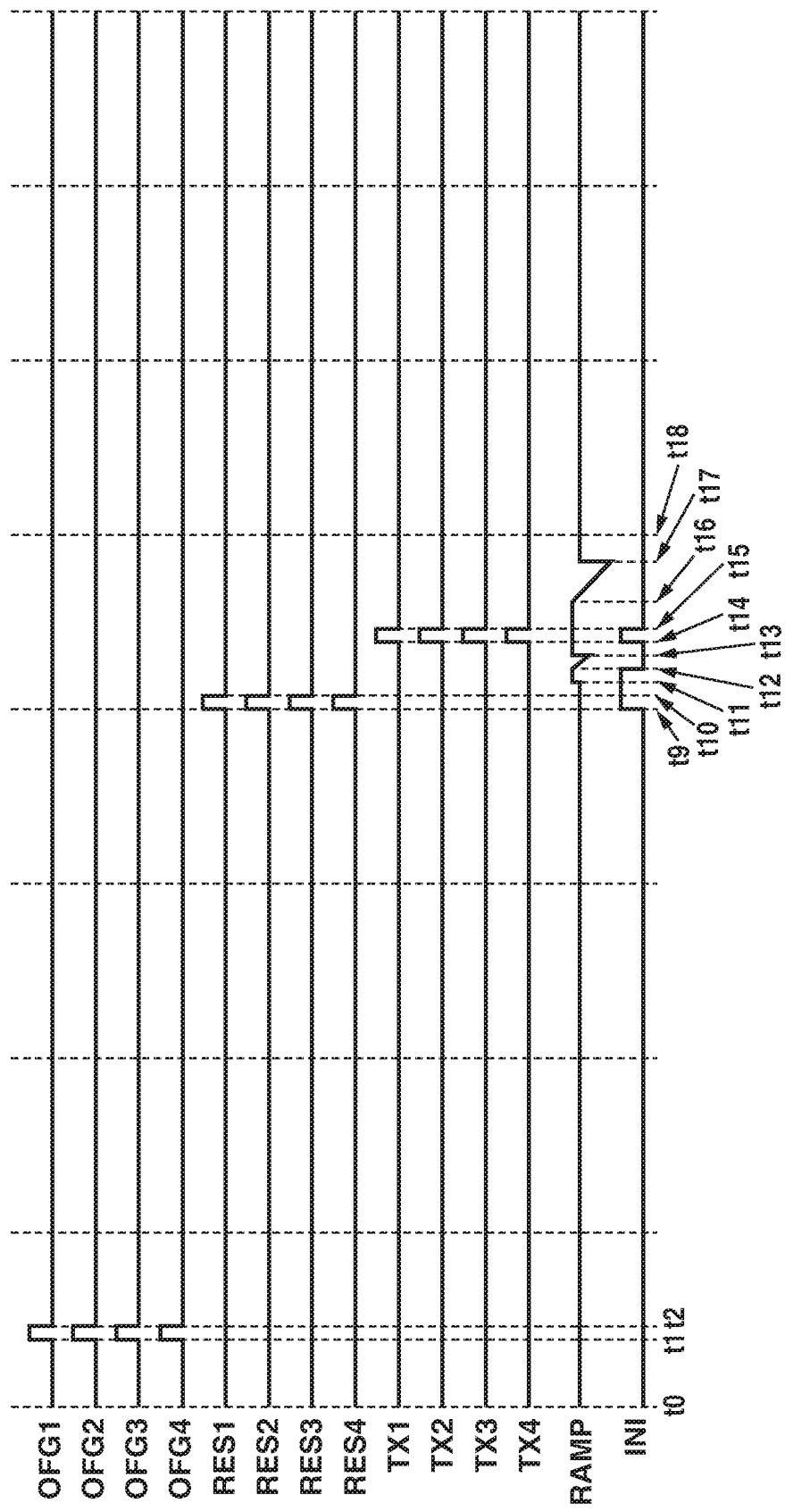
FIG. 6 is a timing chart for describing an operation of the photoelectric conversion apparatus.

Next, an operation of the photoelectric conversion apparatus according to the present exemplary embodiment will be described. FIG. 6 is a timing chart for describing the operation of the photoelectric conversion apparatus. FIG. 6 illustrates the control signals OFG, the control signals RES, the control signals TX, a ramp signal RAMP, and the initialization signal INI. The numerals at the ends of symbols correspond to row numbers in FIG. 1.

In a period from time t1 to time t2, charges in the photoelectric conversion units 130 of all the rows are simultaneously discharged (reset). The photoelectric conversion units 130 then accumulate signal charges generated by incident light. Then, in a period from time t9 to time t10, the potentials of the gates of the input transistors 160 (input nodes of the comparators) in all the rows are reset.

At time t11, the level of the ramp signal RAMP is raised to bring the potentials of the output nodes of the comparators (drains of the transistors 210) to the power supply voltage. This turns off the transistors 230.

Then, at time t12, the initialization signal INI is set to the low level. If the initialization signal INI is set to the low level with the transistors 230 on, the transistors 220 turn on immediately after the initialization signal INI comes to the low level. The initialization signal INI is therefore desirably set to the low level with the transistors 230 off. At time t12, the ramp signal RAMP starts to change in potential, i.e., starts a slope operation.

At some timing between time t12 and time t13, the potentials of the output nodes of the comparators, i.e., the latch signals are inverted. The operation is as described in FIG. 3. Based on the inversion of the latch signals, the memory circuits 260 store a reset level signal. The reset level signal is a digital signal corresponding to the potential of the input node of the comparator in a state where the pixel 100 is reset.

Between time t14 and time t15, signal charges are transferred from the photoelectric conversion units 130 to the gates of the input transistors 160. In other words, signals based on the signal charges generated in the photoelectric conversion units are input to the gates of the input transistors 160. The signal charges are simultaneously transferred in all the rows. The period from time t2 to time t15 is an exposure period or accumulation period.

In a period from time t16 to time t17, AD conversion is performed on the signals based on the signal charges generated in the photoelectric conversion units 130. At some timing between time t16 and time t17, the potentials of the output nodes of the comparators, i.e., the latch signals are inverted. The memory circuits 260 store light level signals based on the inversion of the latch signals. The light level signals are digital signals corresponding to the signals based on the signal charges generated in the photoelectric conversion units 130.

The reset level signals stored in the memory circuits 260 are transferred to a processing unit (not illustrated) in a subsequent stage during the period from time t13 to time t16. After time t17, the light level signals are transferred to the processing unit. The processing unit then performs differential processing between the reset level signals and the light level signals, and outputs difference signals to outside. The transfer of the digital signals from the memory circuits 260 to the processing unit may be sequentially performed row by row, or may be simultaneously performed for all the pixels 100.

In the foregoing operation, the discharging transistors 120 in all the rows operate in synchronization with each other, and thus the transfer transistors 140 in all the rows operate in synchronization with each other. The exposure periods of all the rows therefore coincide. A global electronic shutter operation is thereby performed.

[Other Aspects]

In the present exemplary embodiment, the control wirings 501 in FIG. 5 supply control signals for performing a global electronic shutter operation. It is preferable that such wirings in particular are low in parasitic capacitance. In a global electronic shutter operation, the transistors of a large number of rows of pixels 100 operate synchronously. For that purpose, the reading circuit 110 (scanning circuit) changes the voltages of the control wirings 501 in the plurality of rows at the same time. If the parasitic capacitances of the control wirings 501 are high, the output circuit of the reading circuit 110 needs to have extremely high driving power. In view of power consumption and miniaturization of the photoelectric conversion apparatus, the output circuit having high driving power is disadvantageous. The control wirings 501 connected to the plurality of pixels 100 are therefore arranged on the first semiconductor substrate 301, whereby a photoelectric conversion apparatus suitable for a global electronic shutter operation can be provided.

In another aspect, focus attention on a pixel group including a plurality of pixels 100. The number of bonding portions connected to control wirings 501 is smaller than the number of bonding portions connected to connection wirings 502 inside the pixel circuits. An example of the pixel group is a row. As a concrete example, suppose that a single row includes 8000 pixels. Here, the control wirings 501 are connected to the transistors of the 8000 pixels 100. The number of bonding portions connected to a control wiring 501 is one. Meanwhile, each of the 8000 pixels 100 uses at least one connection wiring 502. Considering a single row of pixels 100, 8000 or more connection wirings 502 are thus arranged. The number of bonding portions connected to the control wirings 501 in a row is therefore smaller than the number of bonding portions connected to the connection wirings 502.

A control wiring 501 may be connected with a plurality of bonding portions. For example, if reading circuits 110 are arranged on both sides of the pixel array, the control wirings 501 each are connected to two bonding portions. Such a configuration can increase the driving power for driving the control wirings 501. As a result, the accuracy of the signals output from the photoelectric conversion apparatus can be improved.

Figure 7:
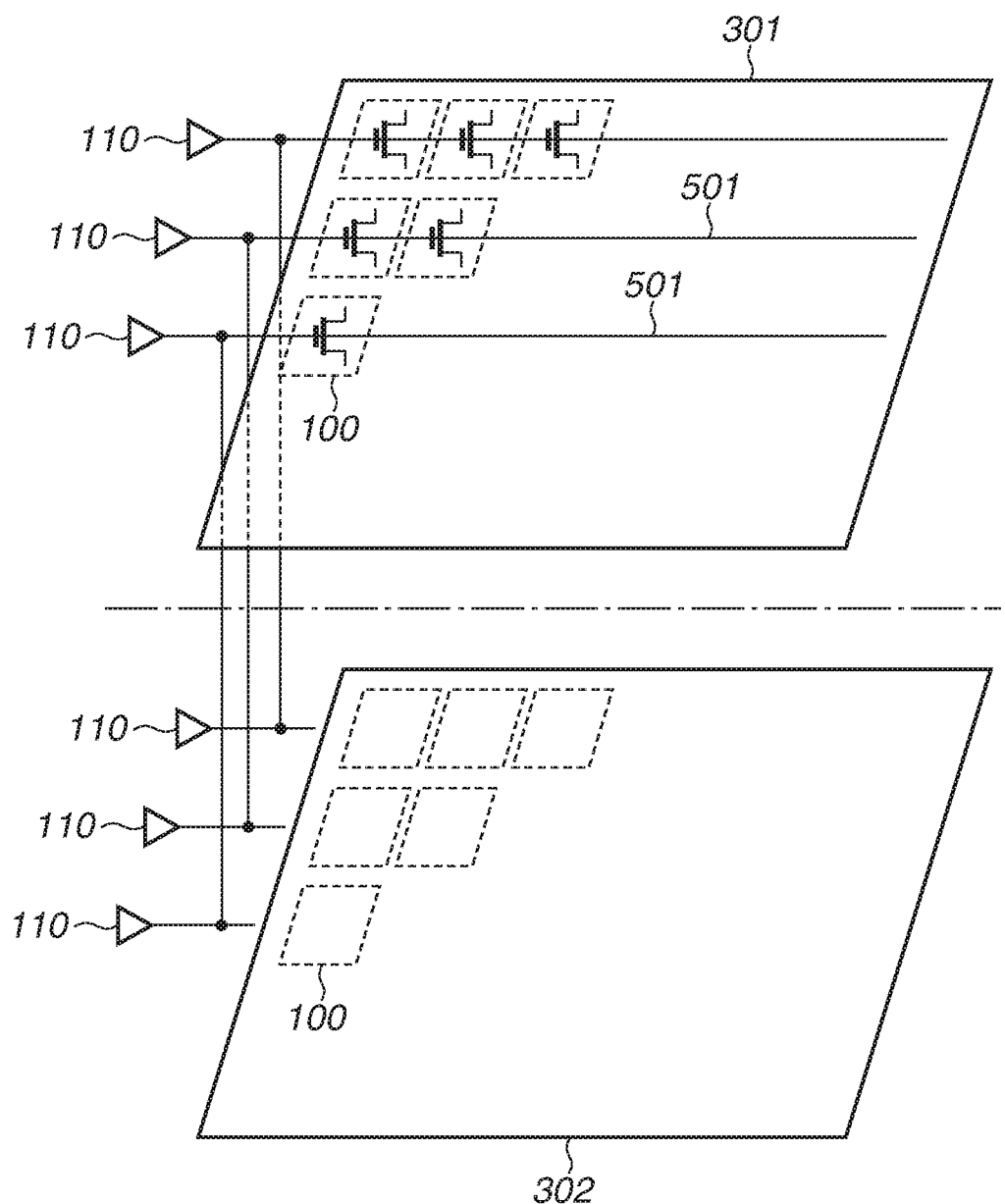
FIG. 7 is a diagram schematically illustrating an arrangement and connection of two semiconductor substrates.

If a plurality of reading circuits 110 is provided, at least one reading circuit 110 may be arranged on the first semiconductor substrate 301 and at least one on the second semiconductor substrate 302. FIG. 7 illustrates a modification of FIG. 5. A difference between FIGS. 5 and 7 is that a reading circuit 110 is added to the first semiconductor substrate 301. Such a configuration can increase the driving power for driving the control wirings 501. As a result, the accuracy of the signals output from the photoelectric conversion apparatus can be improved.

Figure 8:
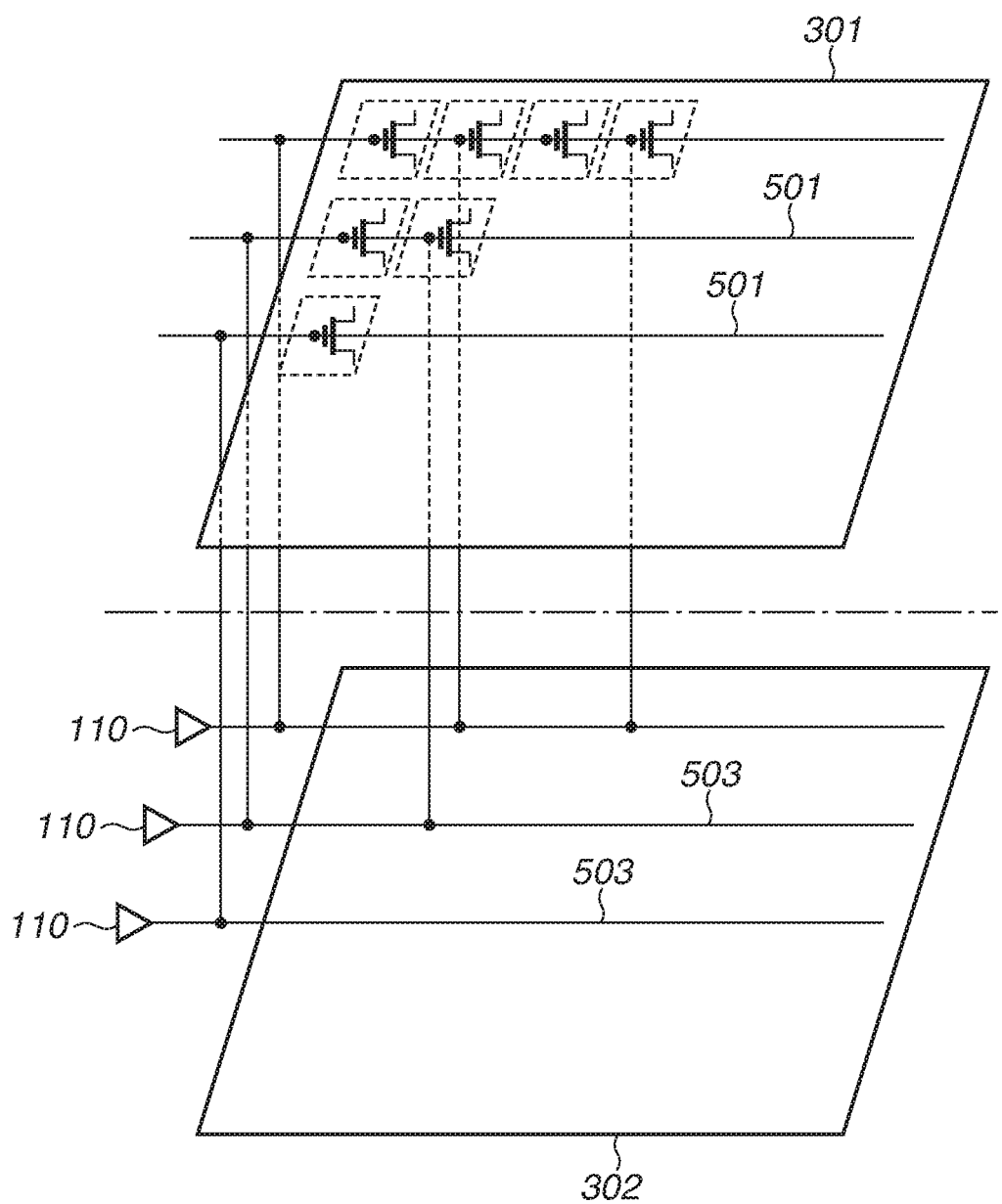
FIG. 8 is a diagram schematically illustrating an arrangement and connection of two semiconductor substrates.

To reduce the resistances of the control wirings 501, the control wirings 501 on the first semiconductor substrate 301 may be connected to control wirings 503 arranged on the second semiconductor substrate 302. FIG. 8 illustrates a modification of FIG. 5. A difference between FIGS. 5 and 8 is that the control wirings 503 are added to the second semiconductor substrate 302. In FIG. 8, the control wirings 501 each are connected to three or more bonding portions. Such a configuration can improve the accuracy of the signals output from the photoelectric conversion apparatus.

Figure 9:
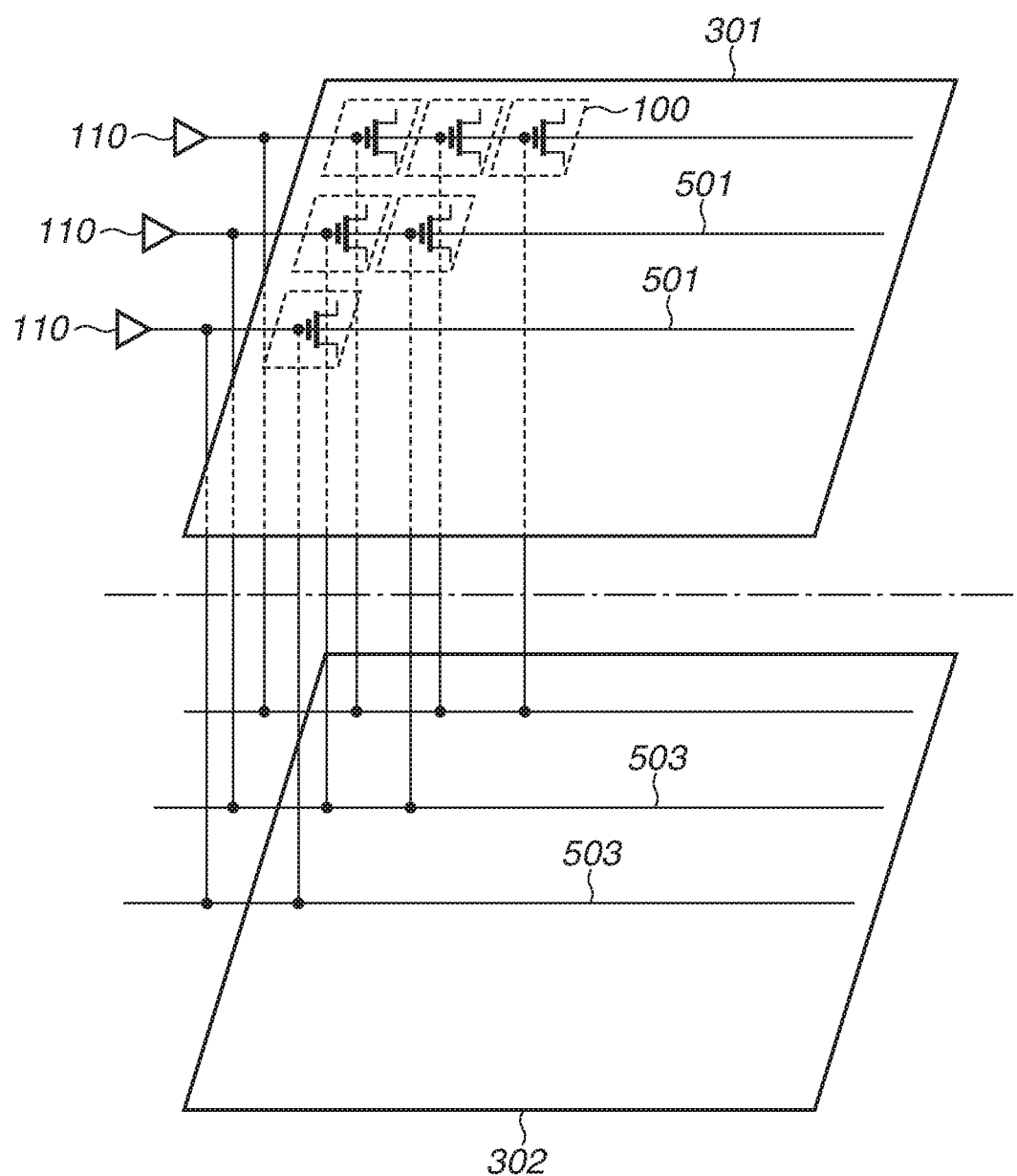
FIG. 9 is a diagram schematically illustrating an arrangement and connection of two semiconductor substrates.

If the control wirings 501 of the first semiconductor substrate 301 and the control wirings 503 of the second semiconductor substrate 302 are used, the reading circuit 110 may be arranged on the first semiconductor substrate 301. FIG. 9 illustrates a modification of FIG. 8. A difference from FIG. 8 is that the reading circuit 110 is arranged on the first semiconductor substrate 301. In FIG. 8, one bonding portion is provided for two pixels 100. In FIG. 9, one bonding portion is provided for one pixel 100. The number of bonding portions is thus arbitrary.

As described above, the control wirings 501 according to the present exemplary embodiment are arranged on the first semiconductor substrate 301. The control wirings 501 are then connected to the transistors of a plurality of pixels 100 in common. Such a configuration can improve the accuracy of the signals output from the photoelectric conversion apparatus.

A photoelectric conversion apparatus according to a second exemplary embodiment will be described. In the first exemplary embodiment, the reference transistors 170 are arranged on the first semiconductor substrate 301. By contrast, in the present exemplary embodiment, the reference transistors 170 are arranged on the second semiconductor substrate 302. The following description deals with differences from the first exemplary embodiment. A description of portions similar to those of the first exemplary embodiment will be omitted.

The overall configuration of the photoelectric conversion apparatus and the functional blocks of the pixels 100 according to the present exemplary embodiment are similar to those in the first exemplary embodiment. That is, FIG. 1 schematically illustrates the configuration of the photoelectric conversion apparatus. FIG. 2 is a block diagram schematically illustrating the configuration of a pixel 100. A description of such drawings is similar to that in the first exemplary embodiment and will therefore be omitted.

Figure 10:
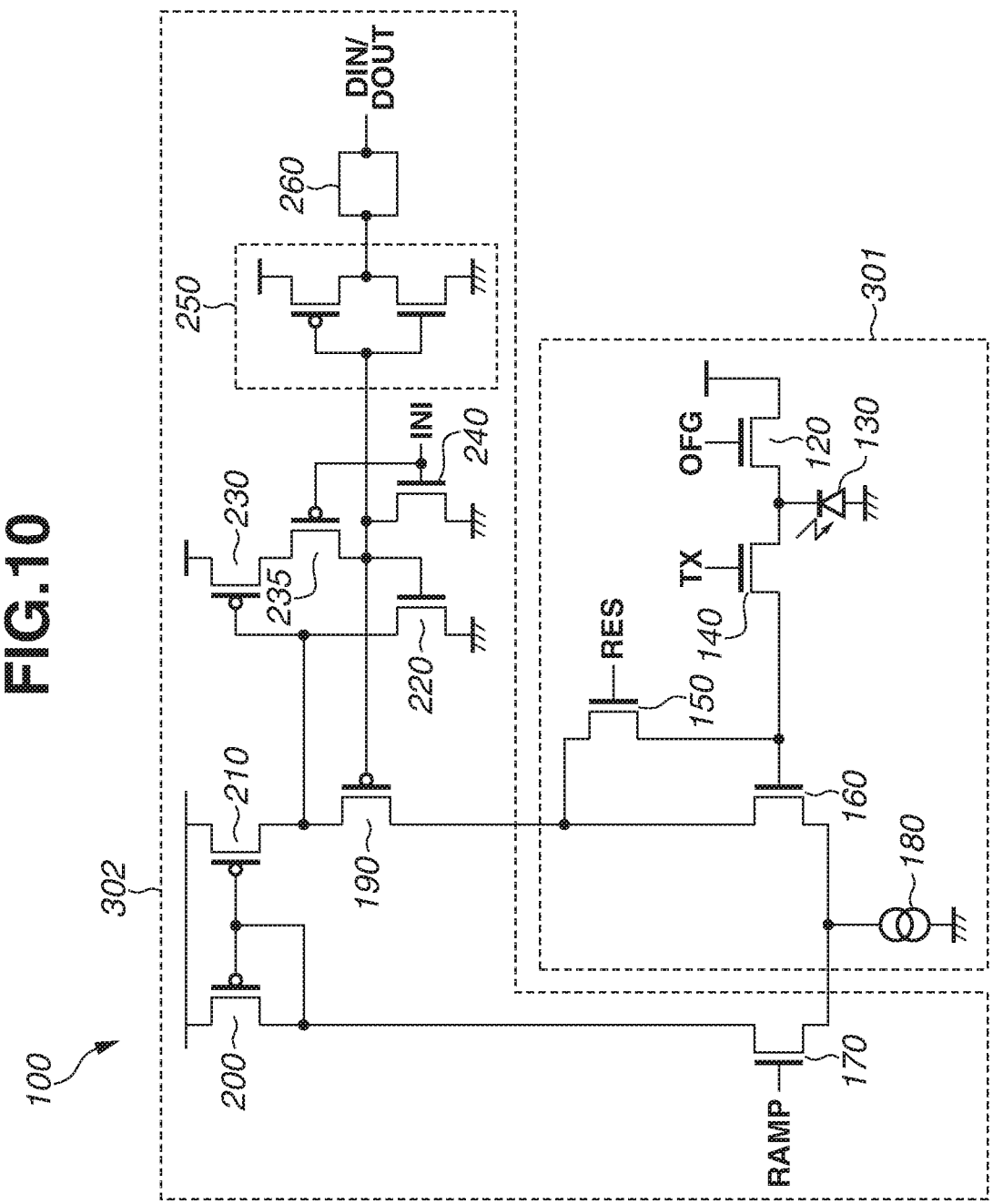
FIG. 10 is a diagram illustrating an equivalent circuit of a pixel of a photoelectric conversion apparatus.

FIG. 10 is a diagram illustrating an equivalent circuit of the pixel 100. The memory circuit 260 is illustrated as a block. As illustrated in FIG. 10, the equivalent circuit of the pixel 100 according to the present exemplary embodiment is the same as that in the first exemplary embodiment (FIG. 3). A description of the functions of the circuit blocks will therefore be omitted.

A difference from the first exemplary embodiment is that the input transistor 160 and the reference transistor 170 are arranged on respective different semiconductor substrates.

Specifically, the photoelectric conversion unit 130 is arranged on the first semiconductor substrate 301. The signal charge processing circuit 10 including the discharging transistor 120, the transfer transistor 140, and the reset transistor 150 is arranged on the first semiconductor substrate 301.

The input transistor 160 and the current source 180 of the differential pair circuit 11 is arranged on the first semiconductor substrate 301. On the other hand, the reference transistor 170 of the differential pair circuit 11 is arranged on the second semiconductor substrate 302. The present exemplary embodiment differs from the first exemplary embodiment in this respect.

In other respects, the present exemplary embodiment is similar to the first exemplary embodiment. The current mirror circuit 13 including the transistors 200 and 210 is arranged on the second semiconductor substrate 302. The positive feedback circuit 14 including the four transistors 220, 230, 235, and 240 is arranged on the second semiconductor substrate 302. The level shifter circuit 250 and the memory circuit 260 are arranged on the second semiconductor substrate 302. The reading circuit 110 in FIG. 1 and the ramp signal generation circuit 12 in FIG. 2 are both arranged on the second semiconductor substrate 302.

As described above, the pixel 100 includes an ADC circuit. The ADC circuit of the pixel 100 is divided and arranged on two semiconductor substrates. Specifically, a part of the differential pair circuit 11 of the ADC circuit is arranged on the first semiconductor substrate 301. The other part of the differential pair circuit 11 of the ADC circuit is arranged on the second semiconductor substrate 302. The current mirror circuit 13 and the memory circuit 260 of the ADC circuit are arranged on the second semiconductor substrate 302.

A relative arrangement of the two semiconductor substrates 301 and 302 and the layout of the wirings are similar to those in the first exemplary embodiment. That is, FIGS. 5 and 7 are diagrams schematically illustrating the arrangement and connection of the first semiconductor substrate 301 and the second semiconductor substrate 302. In the present exemplary embodiment, the connection wiring 502 in FIG. 5 corresponds to the wiring connecting the input transistor 160 and the current limiting transistor 190 and the wiring connecting the reference transistor 170 and the current source 180.

Like the first exemplary embodiment, the control wirings 501 according to the present exemplary embodiment are arranged on the first semiconductor substrate 301. In other words, the control wirings 501 are arranged between the bonding portions and the first semiconductor substrate 301. The control wirings 501 are then connected to the transistors (discharging transistors 120, transfer transistors 140, and reset transistors 150) of a plurality of pixels 100 in common. In other words, the control wirings 501 supply the control signals TX, the control signals OFG, and the control signals RES of FIG. 1 to the plurality of pixels 100. The number of bonding portions for connecting the control wirings 501 to the reading circuit 110 arranged on the second semiconductor substrate 302 can thus be reduced. Such a configuration can reduce the parasitic capacitances of the control wirings 501. The delay of supply of the control signals and the deformation of the waveforms of the control signals can thus be reduced. As a result, the accuracy of the signals output from the photoelectric conversion apparatus can be improved.

Figure 11A:
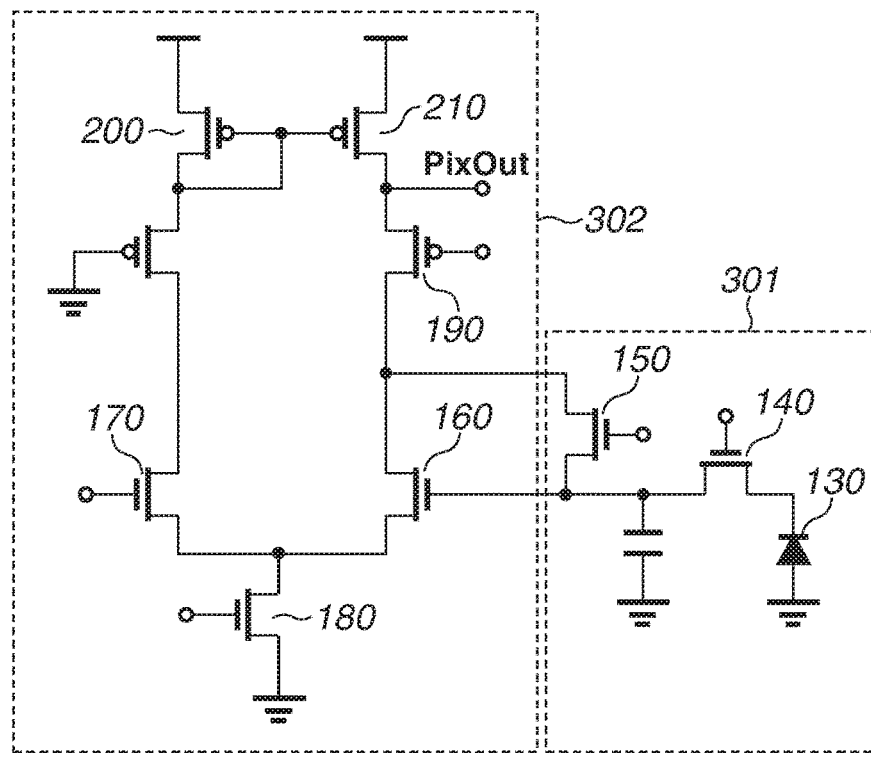
FIGS. 11A and 11B are diagrams illustrating equivalent circuits of the pixel of the photoelectric conversion apparatus.
Figure 11B:
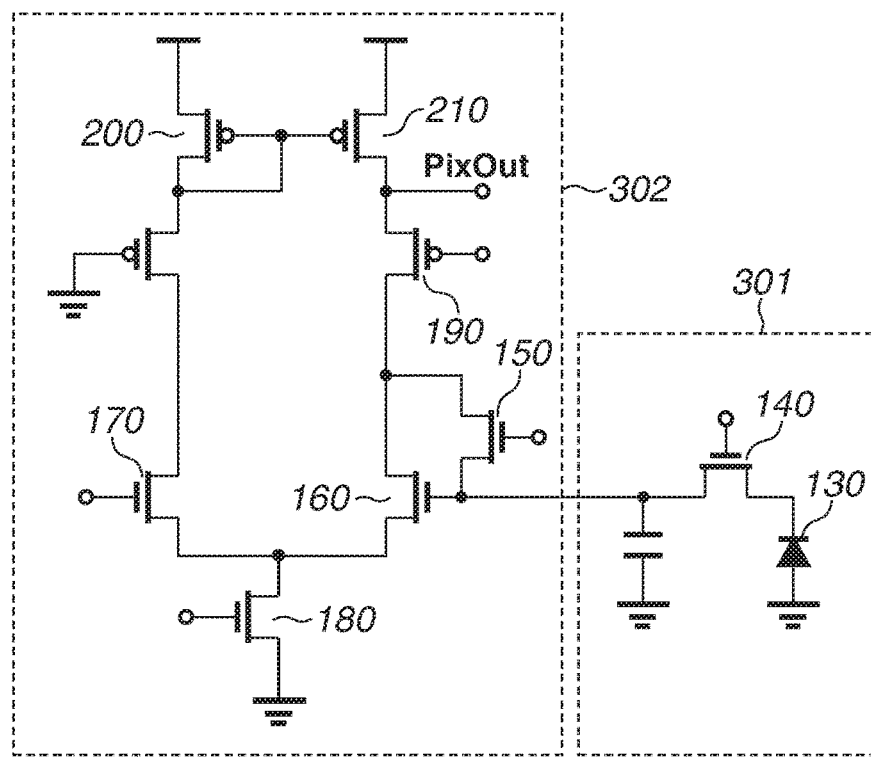

Variations of the arrangement distribution of the pixel circuits will be described. FIGS. 11A and 11B are diagrams illustrating an equivalent circuit of a pixel 100. Portions having similar functions to those in FIG. 3, 4, or 10 are designated by the same reference numerals.

FIG. 11A illustrates an example in which the photoelectric conversion unit 130 is arranged on the first semiconductor substrate 301. The signal charge processing circuit 10 including the discharging transistor 120, the transfer transistor 140, and the reset transistor 150 is arranged on the first semiconductor substrate 301.

The differential pair circuit 11 including the input transistor 160, the reference transistor 170, and the current source 180 is arranged on the second semiconductor substrate 302. In other respects, the arrangement is similar to that in the first exemplary embodiment. The current mirror circuit 13 including the transistors 200 and 210 is arranged on the second semiconductor substrate 302. The positive feedback circuit 14 including the four transistors 220, 230, 235, and 240 is arranged on the second semiconductor substrate 302. The level shifter circuit 250 and the memory circuit 260 are arranged on the second semiconductor substrate 302. The reading circuit 110 in FIG. 1 and the ramp signal generation circuit 12 in FIG. 2 are both arranged on the second semiconductor substrate 302.

In the modification illustrated in FIG. 11A, the entire ADC circuit is arranged on the second semiconductor substrate 302. In such a configuration, only the signal charge processing circuit 10 is arranged on the first semiconductor substrate 301. The photoelectric conversion unit 130 can thus be relatively increased in area. As a result, sensitivity can be improved.

In the example of FIG. 11A, the connection wiring 502 in FIG. 5 corresponds to the wiring connecting the gate of the input transistor 160 and the transfer transistor 140 and the wiring connecting the drain of the input transistor 160 and the reset transistor 150.

FIG. 11B illustrates an example in which the reset transistor 150 is arranged on the second semiconductor substrate 302. Part of the signal charge processing circuit 10 may thus be arranged on the second semiconductor substrate 302. Since the arrangement of the other transistors is the same as in the other examples, a description thereof will be omitted.

In the example of FIG. 11B, the connection wiring 502 in FIG. 5 corresponds only to the wiring connecting the gate of the input transistor 160 and the transfer transistor 140. The number of connection wirings 502 connected to bonding portions can thus be reduced. Since the elements arranged on the first semiconductor substrate 301 decrease, the sensitivity of the photosensitive conversion elements 130 can be improved.

As described above, the present exemplary embodiment differs from the first exemplary embodiment in how the pixel circuits are divided. In any of the examples, the accuracy of the signals output from the photoelectric conversion apparatus can be improved as in the first exemplary embodiment.

A third exemplary embodiment is a modification of the foregoing first and second exemplary embodiments. In the present exemplary embodiment, wirings are arranged differently from those in the first and second exemplary embodiments. Differences from the first and second exemplary embodiments will therefore be described.

The overall configuration of a photoelectric conversion apparatus and the functional blocks of pixels 100 according to the present exemplary embodiment are similar to those in the first exemplary embodiment. That is, FIG. 1 schematically illustrates the configuration of the photoelectric conversion apparatus. FIG. 2 is a block diagram schematically illustrating the configuration of a pixel 100. A description of such drawings is similar to that in the first exemplary embodiment and will therefore be omitted.

An equivalent circuit of the pixel 100 according to the present exemplary embodiment is similar to that of the pixel 100 according to the first exemplary embodiment or the second exemplary embodiment. Specifically, FIGS. 3, 4, 10, 11A, and 11B illustrate the equivalent circuit of the pixel 100 according to the present exemplary embodiment.

Figure 12:
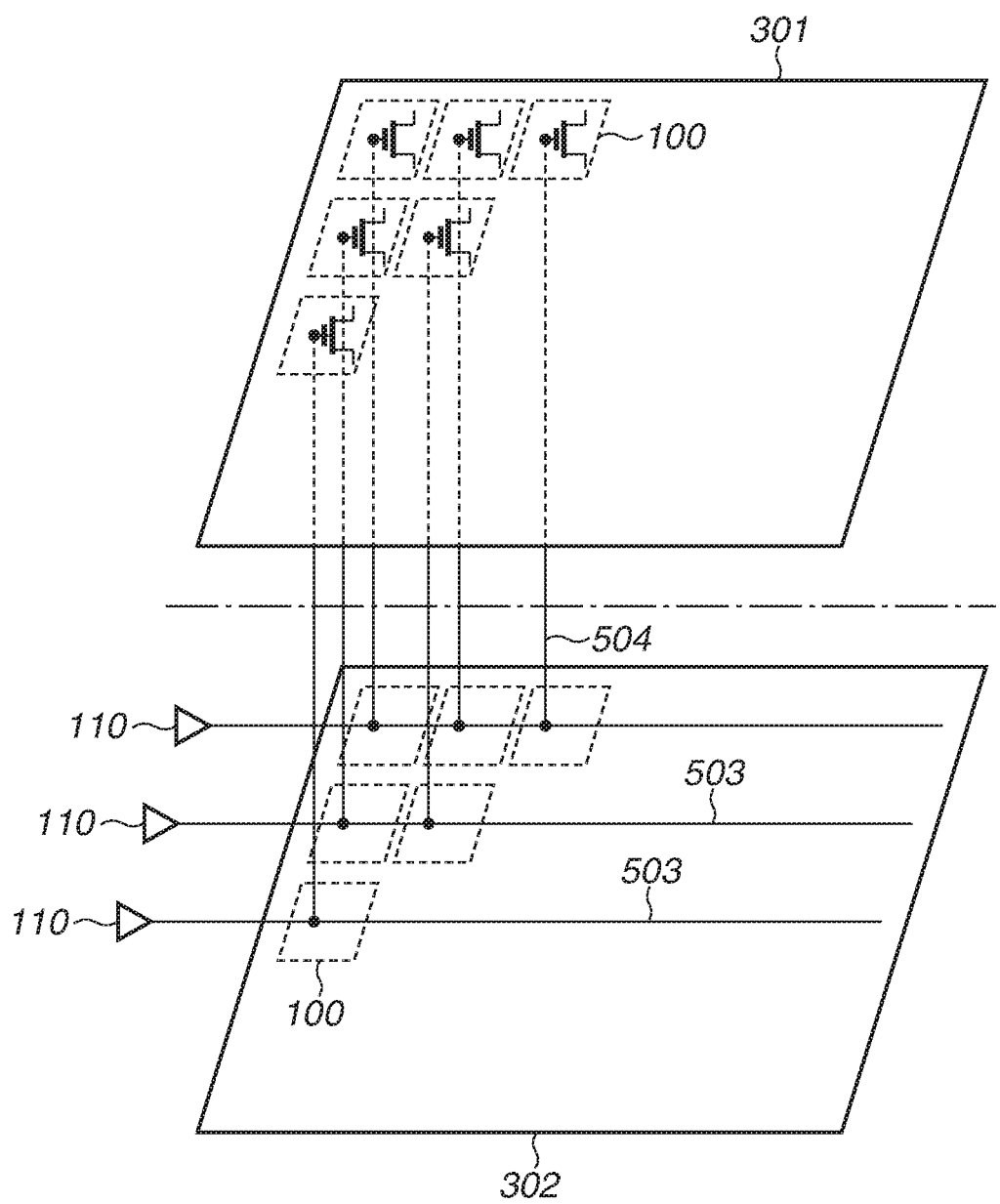
FIG. 12 is a diagram schematically illustrating an arrangement and connection of two semiconductor substrates.

FIG. 12 is a diagram schematically illustrating an arrangement and connection of the first semiconductor substrate 301 and the second semiconductor substrate 302. At least part of the pixel circuits of the plurality of pixels 100 are two-dimensionally arranged in a matrix on the first semiconductor substrate 301. Circuit blocks such as part of the pixel circuits are two-dimensionally arranged in a matrix on the second semiconductor substrate 302.

As illustrated in FIG. 12, control wirings 503 for supplying the control signals to the plurality of pixels 100 are arranged on the second semiconductor substrate 302. A plurality of connection wirings 504 is arranged to correspond to the plurality of pixels 100. The plurality of connection wirings 504 connects transistors that are included in the respective corresponding pixels 100 and arranged on the first semiconductor substrate 301 with the control wirings 503 arranged on the second semiconductor substrate 302. In the present exemplary embodiment, the connection wirings 504 are connected to bonding portions. In other words, a plurality of bonding portions is formed to correspond to the plurality of connection wirings 504.

The reading circuit 110 is arranged on the second semiconductor substrate 302. The reading circuit 110 supplies the control signals to the transistors arranged on the first semiconductor substrate 301 via the control wirings 503 and the connection wirings 504.

Figure 13:
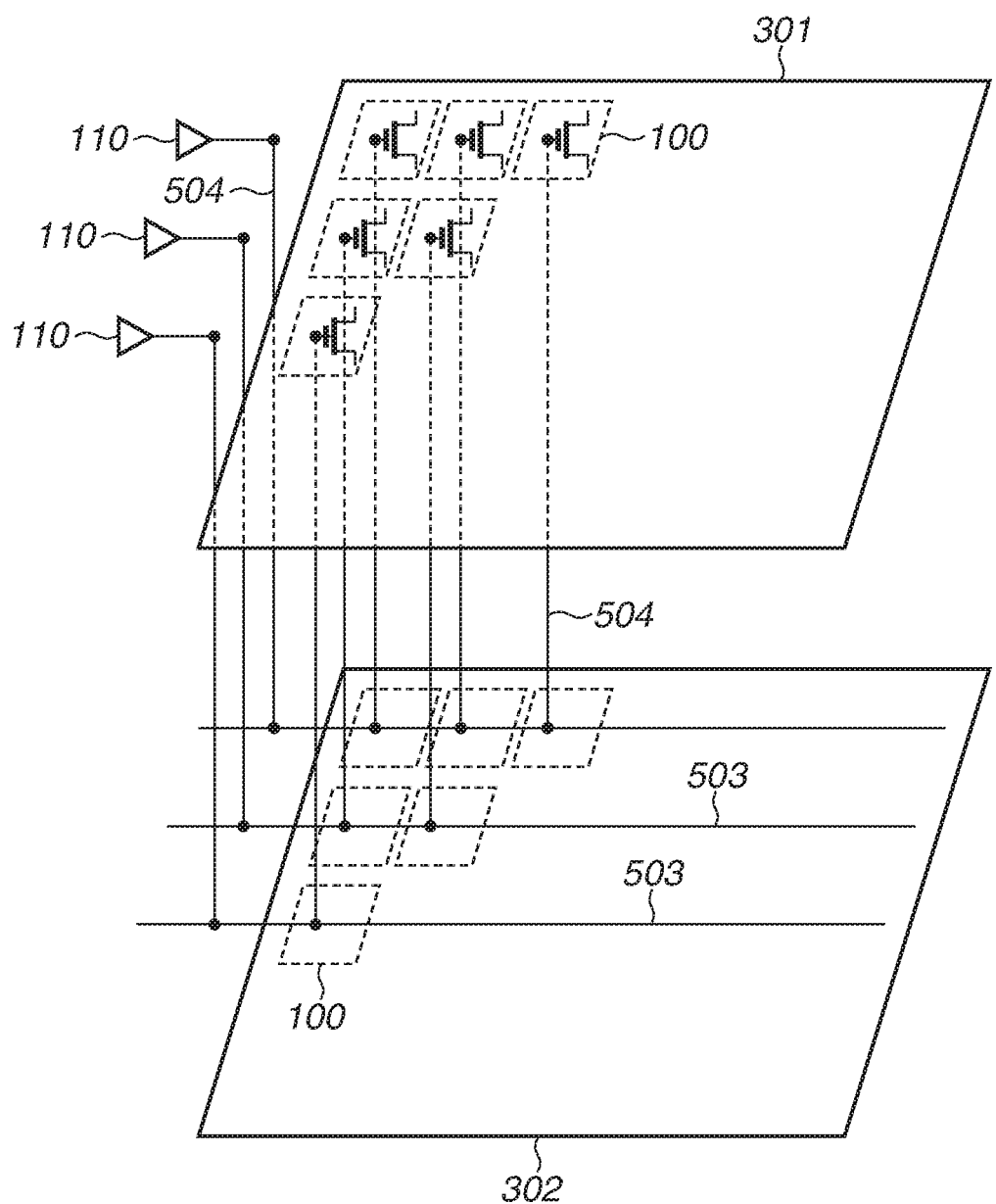
FIG. 13 is a diagram schematically illustrating an arrangement and connection of two semiconductor substrates.

The reading circuit 110 may be arranged on the first semiconductor substrate 301. FIG. 13 illustrates such a modification. FIG. 13 is a diagram schematically illustrating the arrangement and connection of the first semiconductor substrate 301 and the second semiconductor substrate 302. The reading circuit 110 is electrically connected to the control wirings 503 of the second semiconductor substrate 302 via first connection wirings 504. The control wirings 503 are then electrically connected to the transistors of the pixels 100 arranged on the first semiconductor substrate 301 via second connection wirings 504. In other words, the signal path from the reading circuit 110 to the transistor arranged on the first semiconductor substrate 301 include two bonding portions.

In either of the examples of FIGS. 12 and 13, the transistors arranged on the first semiconductor substrate 301 receive the control signals from individual bonding portions. Such a configuration can reduce crosstalk of the control signals to other nodes. Other nodes refer to power supply wirings of the first semiconductor substrate 301 and wells in the first semiconductor substrate 301. Extending control wirings of the first semiconductor substrate 301 across a plurality of pixels 100 increases coupling with the power supply wirings and wells. This facilitates crosstalk in which a change in a control signal propagates to power supply voltage or ground voltage. In the configurations of FIGS. 12 and 13, the control wirings 503 extending across a plurality of pixels 100 are arranged on the second semiconductor substrate 302, whereby the distances from the control wirings 503 to the power supply wirings and wells can be increased. This can reduce crosstalk to the power supply voltage.

Figure 14:
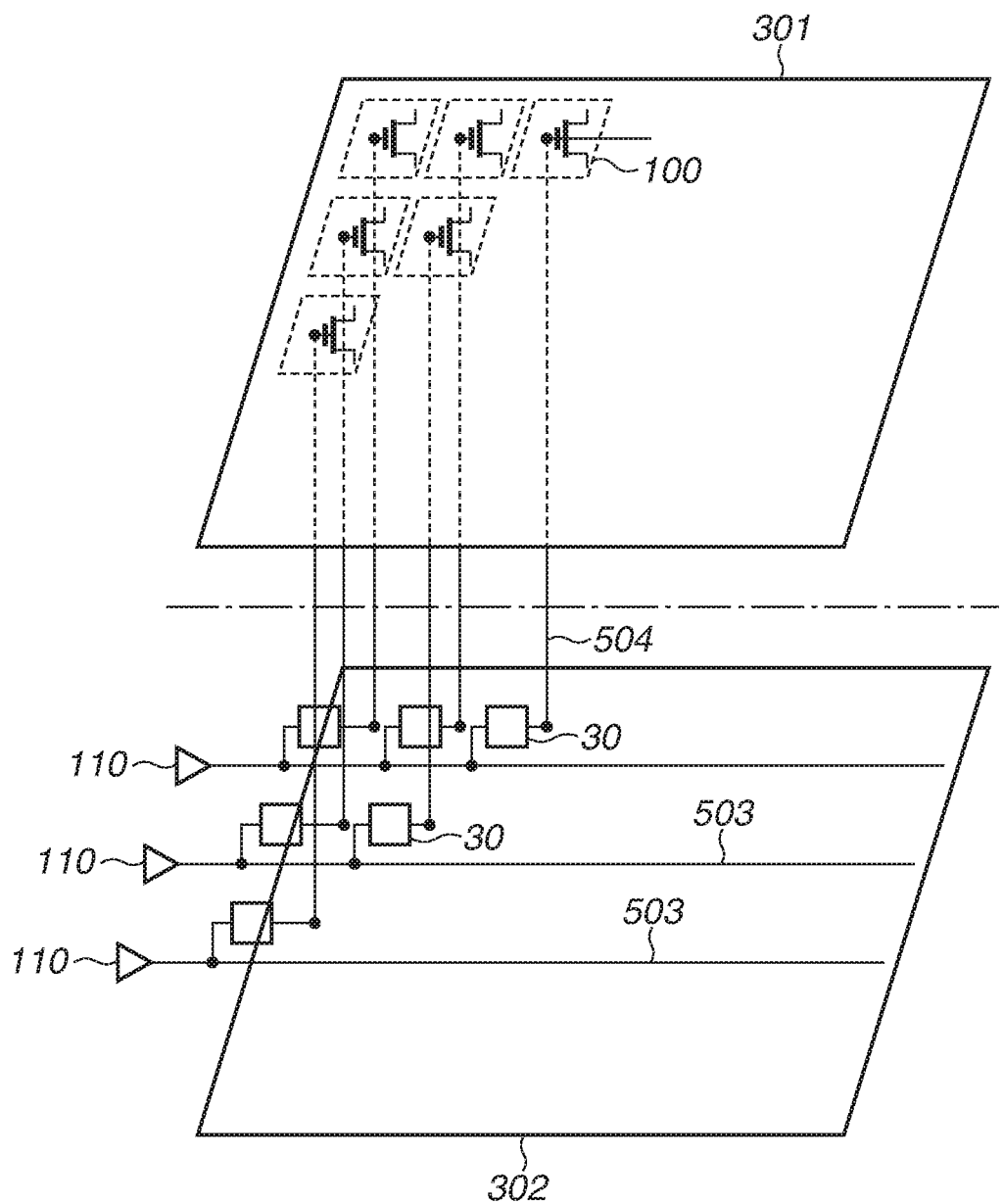
FIG. 14 is a diagram schematically illustrating an arrangement and connection of two semiconductor substrates.

Connecting the wirings for supplying the control signals to the bonding portions formed for the respective pixels 100 is also advantageous in terms of improving the functionality of the photoelectric conversion apparatus. FIG. 14 illustrates a modification of the present exemplary embodiment. FIG. 14 is a diagram schematically illustrating the arrangement and connection of the first semiconductor substrate 301 and the second semiconductor substrate 302. The configuration of the pixels 100 is the same as that in the first exemplary embodiment or the second exemplary embodiment.

In FIG. 14, the control wirings 503 of the second semiconductor substrate 302 are connected to the connection wirings 504 via timing control circuits 30. A plurality of timing control circuits 30 is provided to correspond to the plurality of pixels 100. The timing control circuits 30 delay the control signals supplied to the control wirings 503 by a predetermined time and transmit the delayed control signals to the transistors of the first semiconductor substrate 301. Such a configuration enables mutually independent control of the plurality of pixels 100. For example, the exposure period can be changed depending on position in the pixel array. This can enhance the functionality of the photoelectric conversion apparatus. For example, an object including bright portions and dark portions can be imaged with appropriate gradations.

In the example illustrated in FIG. 14, the plurality of timing control circuits 30 is two-dimensionally arranged in a matrix on the second semiconductor substrate 302. In such an exemplary embodiment, all the pixel circuits may be arranged on the first semiconductor substrate 301.

A fourth exemplary embodiment is a modification of the third exemplary embodiment. The present exemplary embodiment differs from the third exemplary embodiment in the arrangement of wirings. Differences from the third exemplary embodiment will be described.

The overall configuration of the photoelectric conversion apparatus and the functional blocks of the pixels 100 according to the present exemplary embodiment are similar to those in the first exemplary embodiment. That is, FIG. 1 schematically illustrates the configuration of the photoelectric conversion apparatus. FIG. 2 is a block diagram schematically illustrating the configuration of a pixel 100. A description of such drawings is similar to that in the first exemplary embodiment and will therefore be omitted.

An equivalent circuit of the pixel 100 according to the present exemplary embodiment is similar to that of the pixel 100 according to the first to third exemplary embodiments. That is, FIGS. 3, 4, 10, 11A, and 11B illustrate the equivalent circuit of the pixel 100 according to the present exemplary embodiment.

Figure 15:
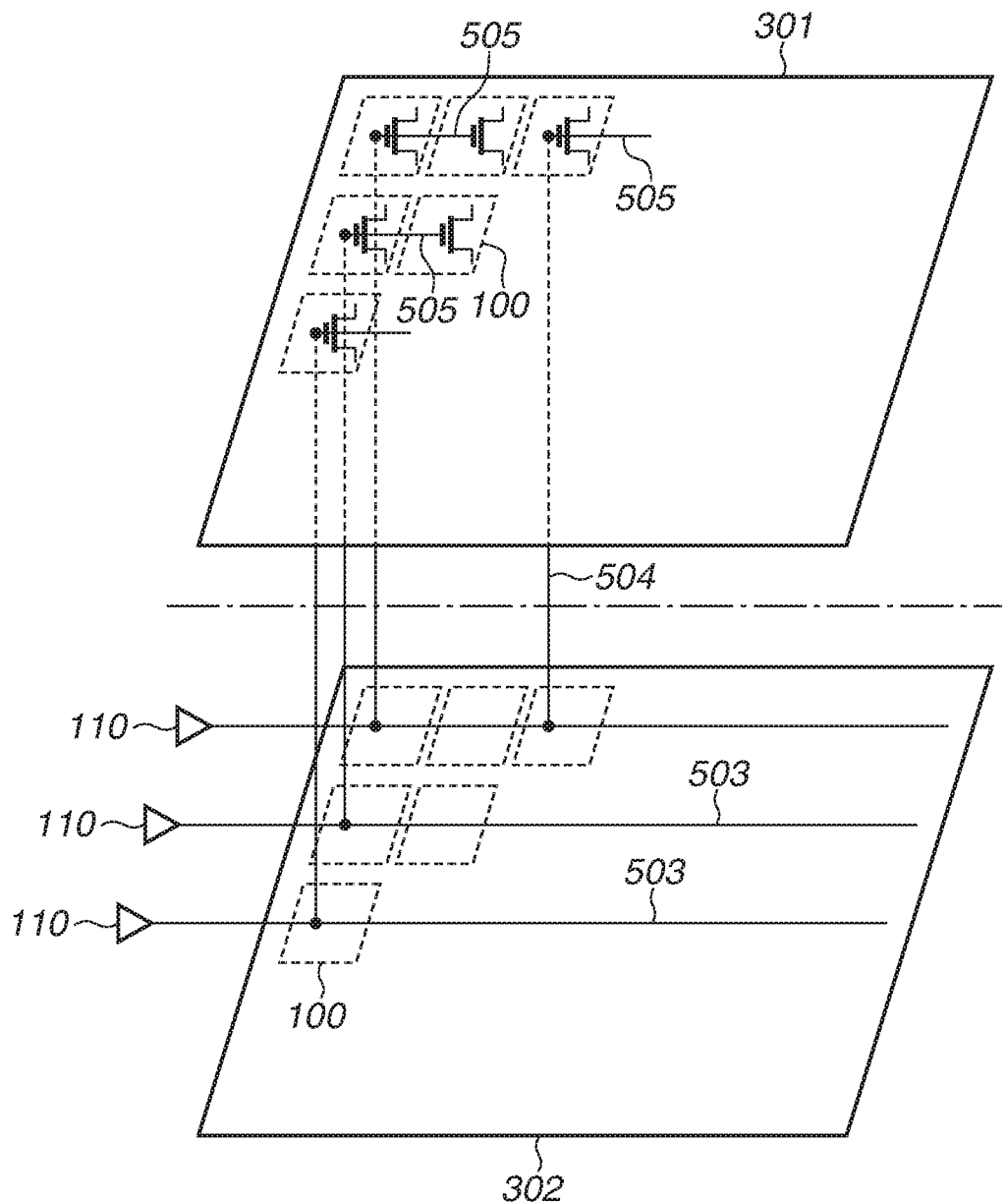
FIG. 15 is a diagram schematically illustrating an arrangement and connection of two semiconductor substrates.

FIG. 15 is a diagram schematically illustrating an arrangement and connection of the first semiconductor substrate 301 and the second semiconductor substrate 302. At least part of the pixel circuits of the plurality of pixels 100 are two-dimensionally arranged in a matrix on the first semiconductor substrate 301. Circuit blocks such as part of the pixel circuits are two-dimensionally arranged in a matrix on the second semiconductor substrate 302.

As illustrated in FIG. 15, the control wirings 503 for supplying the control signals to the plurality of pixels 100 are arranged on the second semiconductor substrate 302. A plurality of block wirings 505 is arranged on the first semiconductor substrate 301. Each of the plurality of block wirings 505 is connected to the transistors of a plurality of pixels 100. In FIG. 15, one block wiring 505 is connected to the transistors of two pixels 100. A plurality of connection wirings 504 is arranged to correspond to the plurality of block wirings 505. The plurality of connection wirings 504 connects the respective corresponding block wirings 505 to the control wirings 503 arranged on the second semiconductor substrate 302.

In FIG. 15, the block wirings 505 are connected to bonding portions. The number of bonding portions can thus be reduced, compared to the exemplary embodiment illustrated in FIG. 12. Since the parasitic capacitances of the wirings can be reduced, the accuracy of the signals output from the photoelectric conversion apparatus can be improved.

In addition to the effect of improving accuracy, crosstalk to the power supply voltage can be reduced as in the third exemplary embodiment. Since the block wirings 505 are shorter than wirings extending across the entire pixel array on the first semiconductor substrate 301, the parasitic capacitance (coupling) between the block wiring 505 and the well of the first semiconductor substrate 301 are small. Crosstalk can thus be reduced. A combination with the timing control circuits 30 according to the third exemplary embodiment enables functional sophistication of the photoelectric conversion apparatus.

In FIG. 15, one block wiring 505 connects the transistors of two pixels 100 included in a row. As a modification, one block wiring 505 may connect the transistors of a plurality of pixels 100 included in a column.

In another modification, one block wiring 505 may mutually connect the transistors of a plurality of pixels 100 that forms a matrix including a plurality of rows and a plurality of columns. Such a configuration is suitable, for example, in controlling the exposure period area by area. Specifically, one of the plurality of timing control circuits 30 in FIG. 14 is connected to a plurality of pixels 100 forming a matrix including a plurality of rows and a plurality of columns via a block wiring 505.

As described above, in the present exemplary embodiment, the block wirings 505 are arranged on the first semiconductor substrate 301. The plurality of block wirings 505 is connected to the control wirings 503 via the respective corresponding connection wirings 504. Such a configuration can provide the effects of the first to third exemplary embodiments at the same time. Specifically, at least either a reduction of crosstalk or functional sophistication of the photoelectric conversion apparatus can be achieved along with an improvement in the accuracy of the signals output from the photoelectric conversion apparatus.

A fifth exemplary embodiment will be described. A difference between the present exemplary embodiment and the first to fourth exemplary embodiments is that the pixel circuits of the pixels 100 are divided and arranged on three semiconductor substrates. Specifically, the memory circuits 260 are arranged on a third semiconductor substrate 303. In other respects, the configurations of the first to fourth exemplary embodiments are applied.

Figure 16:
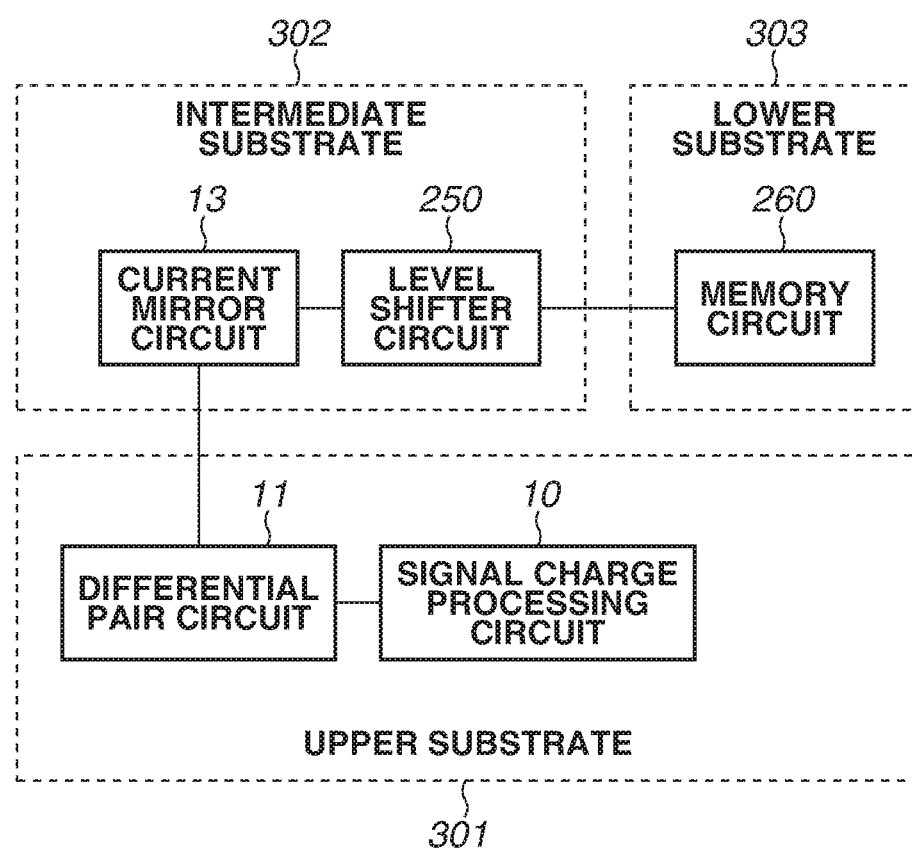
FIG. 16 is a block diagram schematically illustrating a configuration of a pixel of a photoelectric conversion apparatus.

FIG. 16 is a block diagram schematically illustrating a configuration of a pixel 100. The pixel circuit of the pixel 100 functionally includes a plurality of circuit blocks. A signal charge processing circuit 10 accumulates, transfers, and discharges a signal charge generated in a photoelectric conversion unit. A differential pair circuit 11 includes transistors constituting a differential pair and a current source for supplying a current to the differential pair. A current mirror circuit 13 controls the current flowing through the differential pair circuit 11. The differential pair circuit 11 and the current mirror circuit 13 constitute a comparator of an ADC circuit. The pixel circuit of the pixel 100 further includes a level shifter circuit 250 and a memory circuit 260. The level shifter circuit 250 reduces the amplitude of a latch signal output from the comparator. The memory circuit 260 stores a digital signal based on the latch signal output from the comparator. Typically, the differential pair circuit 11, the current mirror circuit 13, and the memory circuit 260 constitute the ADC circuit.

Detailed configurations of the circuit blocks are similar to those in the first exemplary embodiment. That is, FIG. 3 illustrates an equivalent circuit diagram of the pixel 100 according to the present exemplary embodiment. A not-illustrated ramp signal generation circuit 12 supplies a ramp signal to the ADC circuit. The pixel 100 according to the present exemplary embodiment does not include the positive feedback circuit 14. The output node of the comparator is then directly connected to the level shifter circuit 250. However, like the first exemplary embodiment, the pixel 100 may include the positive feedback circuit 14. The positive feedback circuit 14 accelerates inversion of the output of the comparator. In other words, the positive feedback circuit 14 generates a pulse that rises (or falls) more quickly in response to that the output of the comparator starts inverting.

As illustrated in FIG. 16, the photoelectric conversion unit 130, the signal charge processing unit 10, and the differential pair circuit 11 are arranged on a first semiconductor substrate 301 (upper substrate). The current mirror circuit 13 and the level shifter circuit 250 are arranged on a second semiconductor substrate 302 (intermediate substrate). The memory circuit 260 is arranged on the third semiconductor substrate 303 (lower substrate). The first semiconductor substrate 301, the second semiconductor substrate 302, and the third semiconductor substrate 303 are stacked in order from a side closer to a light source (object).

The present exemplary embodiment can provide effects similar to those of the first to fourth exemplary embodiments.

Next, a modification (sixth exemplary embodiment) of the configuration of the pixels 100 according to the first to fifth exemplary embodiments will be described. The pixels 100 according to the present exemplary embodiment do not include an ADC circuit. Instead, the pixels 100 according to the present exemplary embodiment each include a signal charge holding unit for holding a signal charge.

[Overall Configuration]

Figure 17:
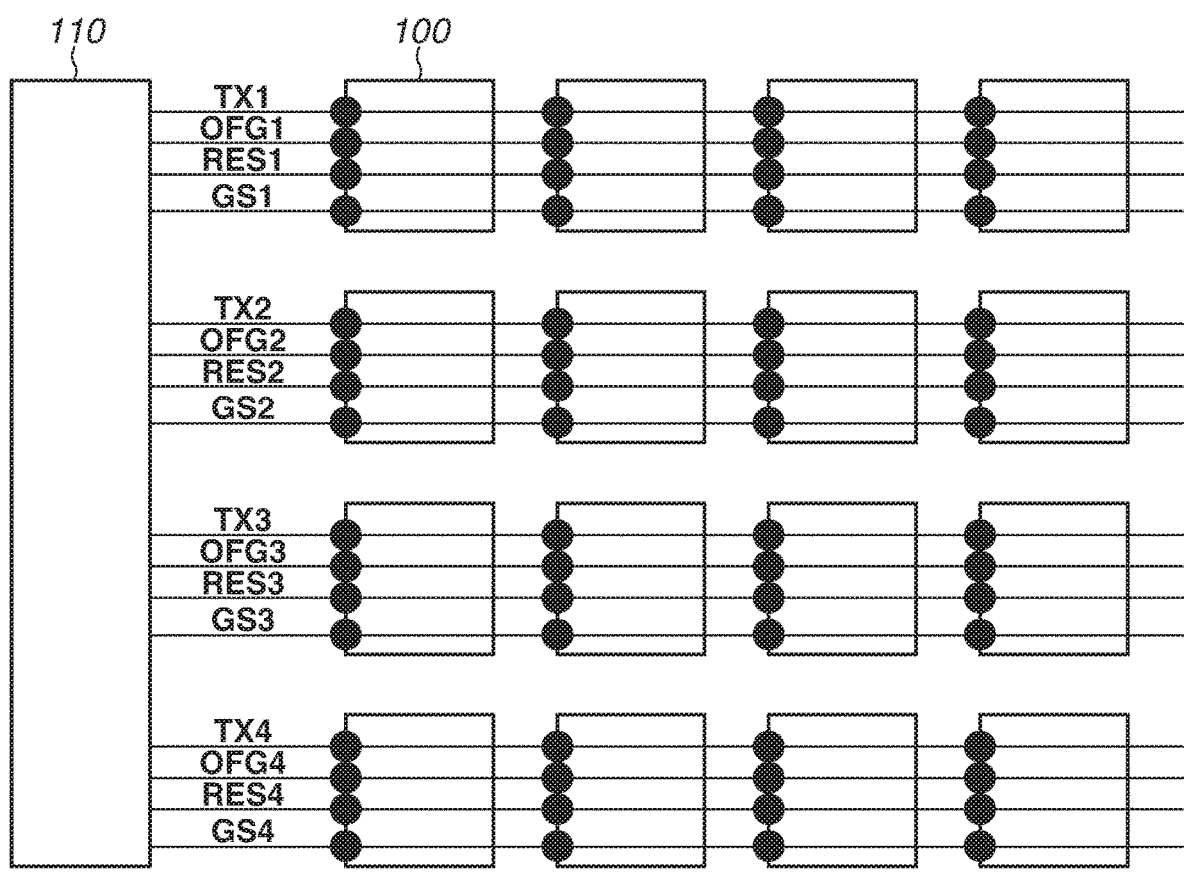
FIG. 17 is a diagram schematically illustrating a configuration of a photoelectric conversion apparatus.

FIG. 17 schematically illustrates a configuration of a photoelectric conversion apparatus. The photoelectric conversion apparatus includes a plurality of pixels 100 and a reading circuit 110 for reading signals from the plurality of pixels 100.

The pixels 100 each include a photoelectric conversion unit and a pixel circuit. The photoelectric conversion unit converts incident light into a signal charge. A photodiode formed on a silicon substrate or an organic photoelectric conversion film stacked on a semiconductor substrate is used as the photoelectric conversion unit. The pixel circuit is a circuit for outputting a signal based on the charge generated in the photoelectric conversion unit from the pixel 100.

The reading circuit 110 is a scanning circuit that supplies control signals (TX1 to TX4, OFG1 to OFG4, RES1 to RES4, and GS1 to GS4) to a plurality of control wirings connected to the pixels 100. The pixels 100 operate based on the control signals, whereby the signals based on the charges generated in the photoelectric conversion units are output from the pixels 100. The reading circuit 110 may be a signal processing circuit that processes the signals output from the pixels 100.

[Pixel Circuit]

Figure 18:
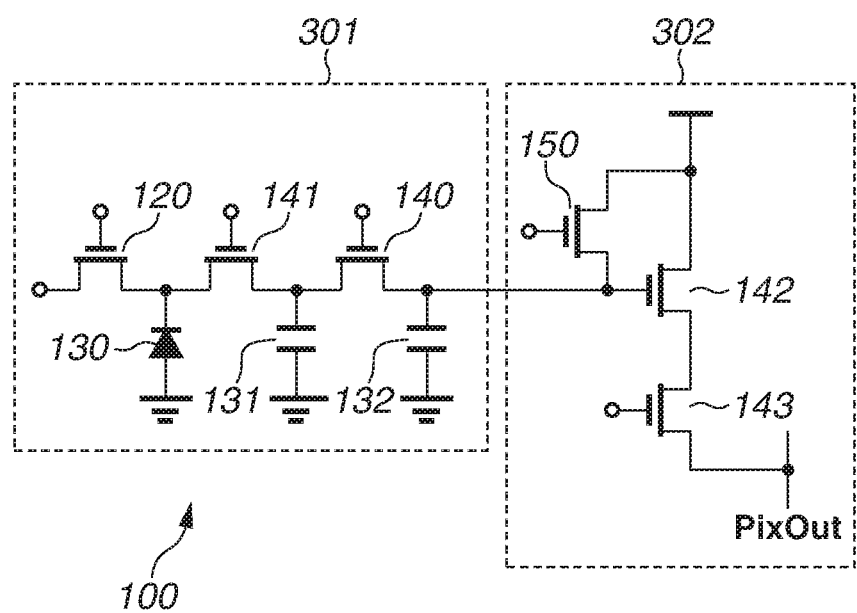
FIG. 18 is a diagram illustrating an equivalent circuit of a pixel of the photoelectric conversion apparatus.

FIG. 18 is a diagram illustrating a circuit configuration of a pixel 100 according to the present exemplary embodiment. The pixel 100 includes a photoelectric conversion unit 130, a charge holding unit 131, a floating diffusion unit 132 (FD unit 132), and an overflow drain (OFD) portion. The pixel 100 further includes a global shutter transistor 141 (GS transistor 141), a transfer transistor 140, a selection transistor 143, a reset transistor 150, an amplification transistor 142, and a discharging transistor 120. Each of the transistors is an MOS transistor. The selection transistor 143 is connected to an output wiring (PixOut). Typically, a plurality of pixels 100 included in one column is connected to one output wiring.

The photoelectric conversion unit 130 generates a signal charge based on the amount of incident light. The charge holding unit 131 is connected to the photoelectric conversion unit 130 via the GS transistor 141. The GS transistor 141 transfers the signal charge in the photoelectric conversion unit 130 to the charge holding unit 131. In the equivalent circuit diagram, the charge holding unit 131 is illustrated as a grounded capacitance or diode. The charge holding unit 131 temporarily holds the signal charge transferred from the photoelectric conversion unit 130.

The FD unit 132 converts the signal charge transferred from the charge holding unit 131 into a voltage signal. The FD unit 132 is connected to the charge holding unit 131 via the transfer transistor 140. The transfer transistor 140 transfers the signal charge in the charge holding unit 131 to the FD unit 132. The FD unit 132 is also connected to the source of the reset transistor 150 and the gate of the amplification transistor 142. A reset voltage is supplied to the drain of the reset transistor 150. Turning on the reset transistor 150 resets the voltage of the FD unit 132.

The amplification transistor 142 outputs a signal based on its gate voltage to the output wiring. For example, in a state where the voltage of the FD unit 132 is reset, the amplification transistor 142 outputs a reset signal. After the transfer transistor 140 is turned on and the signal charge is transferred from the charge holding unit 131 to the FD unit 132, a pixel signal corresponding to the amount of transferred charge is output to the source of the amplification transistor 142.

The source of the amplification transistor 142 is connected to the output wiring via the selection transistor 143. If the selection transistor 143 is turned on, the reset signal or the pixel signal is output to the output wiring. In such a manner, a signal is read from the pixel 100.

The photoelectric conversion unit 130 is connected to the OFD portion (power supply node) via the discharging transistor 120. If the discharging transistor 120 is turned on, the signal charge accumulated in the photoelectric conversion unit 130 is discharged to the OFD portion. A global electronic shutter operation for simultaneously setting all the pixels 100 to a constant exposure time is implemented by simultaneously discharging the charges of all the pixels 100 to the OFD portions and subsequently transferring accumulated signal charges to the charge holding units 131. This suppresses differences occurring in exposure timing due to sequential reading of charges from the pixels, and reduces image distortion. The global electronic shutter operation is an example of a driving method applicable to the imaging apparatus according to the present exemplary embodiment. The imaging apparatus according to the present exemplary embodiment may perform only a rolling shutter operation.

[Stacking of Two Semiconductor Substrates]

In the photoelectric conversion apparatus according to the present exemplary embodiment, the pixel circuit of one pixel 100 is divided and arranged on two semiconductor substrates (first semiconductor substrate 301 and second semiconductor substrate 302). In FIG. 18, the elements arranged on the first semiconductor substrate 301 and the elements arranged on the second semiconductor substrate 302 are distinguished by dotted lines.

Specifically, the photoelectric conversion unit 130 is arranged on the first semiconductor substrate 301. The discharging transistor 120, the transfer transistor 140, and the GS transistor 141 are arranged on the first semiconductor substrate 301. The charge holding unit 131 is further arranged on the first semiconductor substrate 301. On the other hand, the reset transistor 150, the amplification transistor 142, and the selection transistor 143 are arranged on the second semiconductor substrate 302.

A connection and arrangement of the two semiconductor substrates 301 and 302 will be described. In the present exemplary embodiment, the first semiconductor substrates 301 including the photoelectric conversion units 130 and the second semiconductor substrate 302 including part of the pixel circuits are stacked on each other. When the photoelectric conversion units 130 are projected upon the second semiconductor substrate 302 in a direction perpendicular to the surface of the first semiconductor substrate 301, at least some of the transistors of the pixel circuits overlap with the projections of the photoelectric conversion units 130. Specifically, some or all of the reset transistors 150, the amplification transistors 142, and the selection transistors 143 are arranged at positions overlapping with the projections of the photoelectric conversion units 130.

On the first semiconductor substrate 301, a plurality of pixel circuits each including a photoelectric conversion unit 130 and a GS transistor 141 as a single unit is two-dimensionally arranged in a matrix. On the second semiconductor substrate 302, a plurality of pixel circuits each including an amplification transistor 142 and a selection transistor 143 as a single unit is two-dimensionally arranged in a matrix. To put it in a different perspective, first portions of the pixel circuits including the charge holding units 131 are two-dimensionally arranged in a matrix on the first semiconductor substrate 301. Second portions of the pixel circuits including the charge holding units 131 are two-dimensionally arranged in a matrix on the second semiconductor substrate 302.

Figure 19:
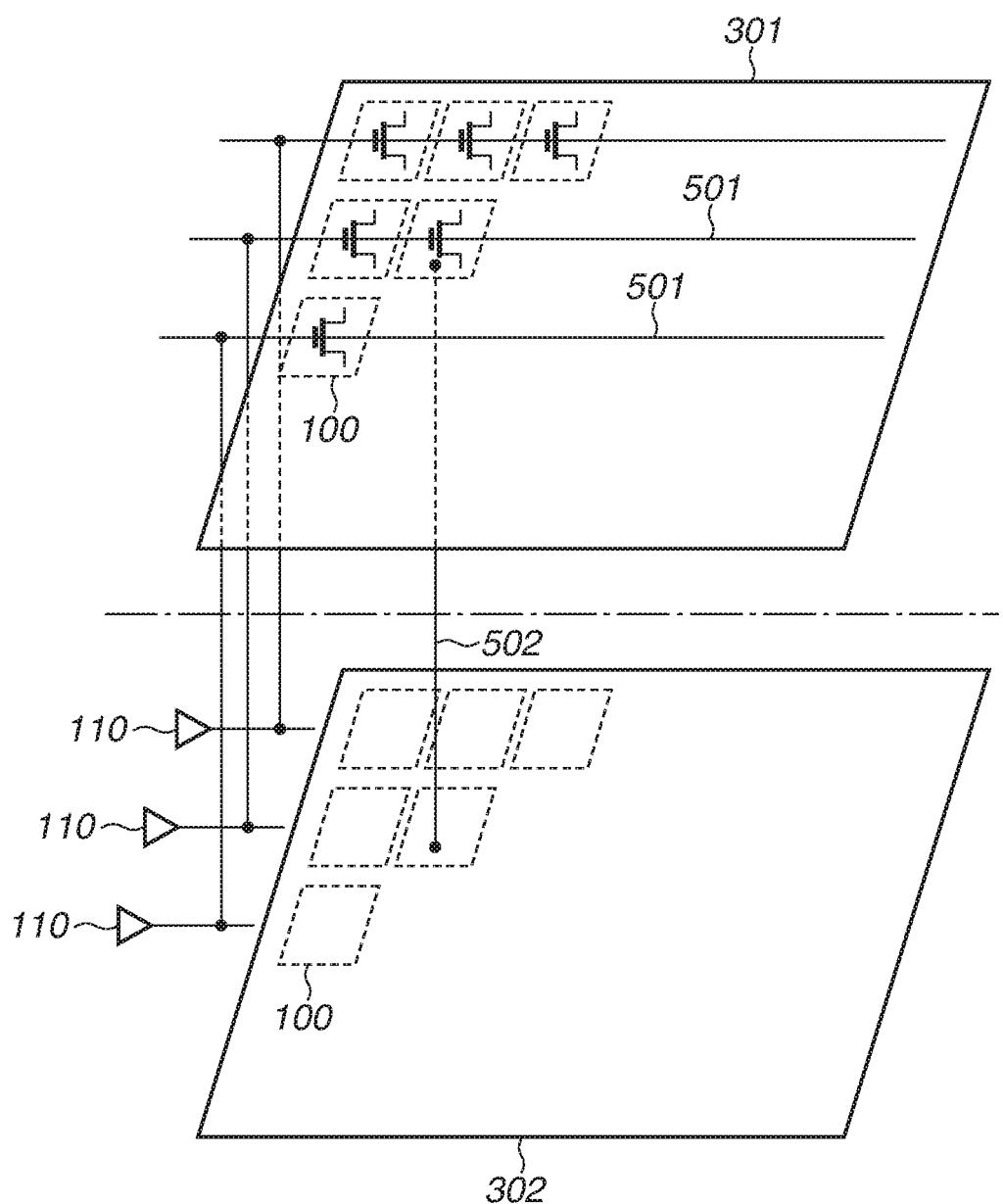
FIG. 19 is a diagram schematically illustrating an arrangement and connection of two semiconductor substrates.

Next, control signals for controlling the transistors of the pixel circuits and an arrangement of wirings for transmitting signals output from the pixels 100 will be described. FIG. 19 illustrates control wirings 501 connected to the transistors arranged on the first semiconductor substrate 301. The control wirings 501 are connected to the gates of the discharging transistors 120, the transfer transistors 140, the GS transistors 141, and the reset transistors 150. In other words, the control wirings 501 supply the control signals TX, the control signals OFG, the control signals RES, and the control signals GS of FIG. 17. As illustrated in FIG. 19, the control wirings 501 are connected to the transistors of a plurality of pixels 100 in common.

FIG. 19 also illustrates a connection wiring 502 that connects a transistor arranged on the first semiconductor substrate 301 and a transistor arranged on the second semiconductor substrate 302 inside a pixel 100. Examples of the connection wiring 502 include a wiring connecting the transfer transistor 140 and the amplification transistor 142 in FIG. 18.

The dot-dashed line passing between the first semiconductor substrate 301 and the second semiconductor substrate 302 represents bonding portions of wirings. The control wirings 501 and the connection wiring 502 are both connected to the bonding portions. The bonding portions are formed by at least two wiring layers. In manufacturing the photoelectric conversion apparatus, at least one wiring layer is formed on each of the first and second semiconductor substrates 301 and 302. Conductive members including in the topmost wiring layer among the wiring layers of the first semiconductor substrate 301 are jointed to conductive members included in the topmost wiring layer among the wiring layers of the second semiconductor substrate 302. In such a manner, the first semiconductor substrate 301 and the second semiconductor substrate 302 are stacked on each other. The conductive member are suitably formed of copper or a copper-containing alloy.

In general, a bonding portion can have a high parasitic capacitance. As the number of bonding portions connected to a wiring increases, the parasitic capacitance of the wiring can increase. In the present exemplary embodiment, the signal paths for supplying the control signals from the reading circuit 110 arranged on the second semiconductor substrate 302 to the transistors of the pixels 100 arranged on the first semiconductor substrate 301 include bonding portions. In other words, the control wirings 501 for transmitting the control signals are connected to the bonding portions. As the parasitic capacitances of the control wirings 501 increase, issues such as delayed supply of the control signals and deformation of the waveforms of the control signals can occur.

To address such issues, the control wirings 501 according to the present exemplary embodiment are arranged on the first semiconductor substrate 301. In other words, the control wirings 501 are arranged between the bonding portions and the first semiconductor substrate 301. The control wirings 501 are then connected to the transistors (discharging transistors 120, transfer transistors 140, GS transistors 141, and reset transistors 150) of a plurality of pixels 100 in common. That is, the control wirings 501 supply the control signals TX, the control signals OFG, the control signals RES, and the control signals GS of FIG. 17 to the plurality of pixels 100. The number of bonding portions used to connect the control wirings 501 to the reading circuit 110 arranged on the second semiconductor substrate 302 can therefore be reduced. Such a configuration can reduce the parasitic capacitances of the control wirings 501. The delay of supply of the control signals and the deformation of the waveforms of the control signals can thus be reduced. As a result, the accuracy of the signals output from the photoelectric conversion apparatus can be improved.

For the sake of simplicity, in FIG. 19, a plurality of control wirings 501 connected to a row of pixels 100 is represented by a single line. In other words, control wirings 501 connected to the discharging transistors 120, control wirings 501 connected to the transfer transistors 140, and control wirings 501 connected to the reset transistors 150 are individually arranged on the first semiconductor substrate 301. Control wirings 501 connected to the GS transistors 141 are also arranged on the first semiconductor substrate 301. It is preferable that two control wirings thus connected to two respective transistors arranged on the same substrate are arranged on the same semiconductor substrate. Such a configuration can reduce a difference between the parasitic capacitances of the two control wirings. As a result, the operation synchronicity of the pixel circuits of the pixels 100 improves, whereby the accuracy of the signals output from the photoelectric conversion apparatus can be improved.

In the present exemplary embodiment, the control wirings 501 in FIG. 19 supply control signals for performing a global electronic shutter operation. Such wirings in particular can be low in parasitic capacitance. In a global electronic shutter operation, the transistors of a large number of rows of pixels 100 operate synchronously. For that purpose, the reading circuit 110 (scanning circuit) changes the voltages of the control wirings 501 in the plurality of rows at the same time. If the parasitic capacitances of the control wirings 501 are high, the output circuit of the reading circuit 110 needs to have extremely high driving power. In view of power consumption and miniaturization of the photoelectric conversion apparatus, the output circuit having high driving power is disadvantageous. The control wirings 501 connected to the plurality of pixels 100 are therefore arranged on the first semiconductor substrate 301, whereby a photoelectric conversion apparatus suitable for a global electronic shutter operation can be provided.

[Modifications]

In a modification of the present exemplary embodiment, the configuration illustrated in FIG. 19 is modified into any one of the configurations illustrated in FIGS. 7 to 9 as described in the first exemplary embodiment. A redundant description of FIGS. 7 to 9 will be omitted.

In a modification of the present exemplary embodiment, the configuration illustrated in FIG. 19 is modified into any one of the configurations illustrated in FIGS. 12 to 14 as described in the third exemplary embodiment. A redundant description of FIGS. 12 to 14 will be omitted.

In a modification of the present exemplary embodiment, the configuration illustrated in FIG. 19 is modified into the configuration illustrated in FIG. 15 as described in the fourth exemplary embodiment. A redundant description of FIG. 15 will be omitted.

Figure 20A:
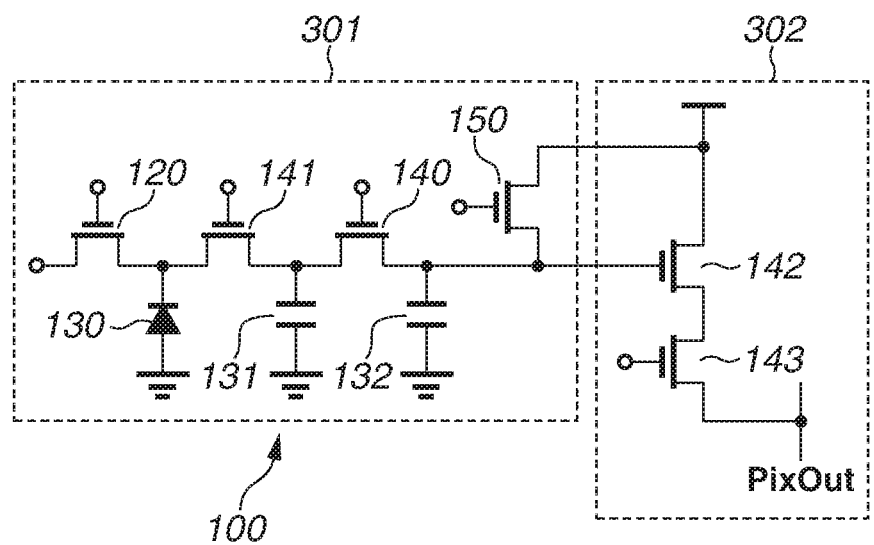
FIGS. 20A, 20B, and 20C are diagrams illustrating equivalent circuits of the pixel of the photoelectric conversion apparatus.
Figure 20B:
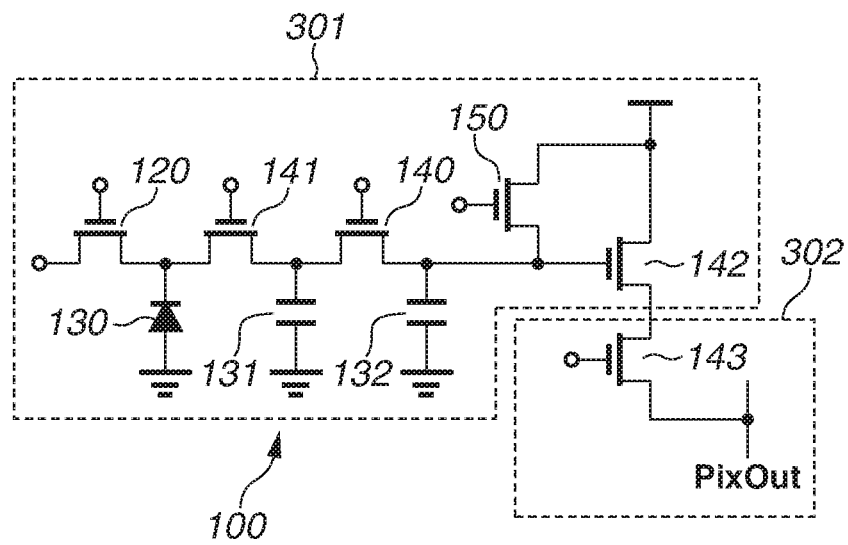
Figure 20C:
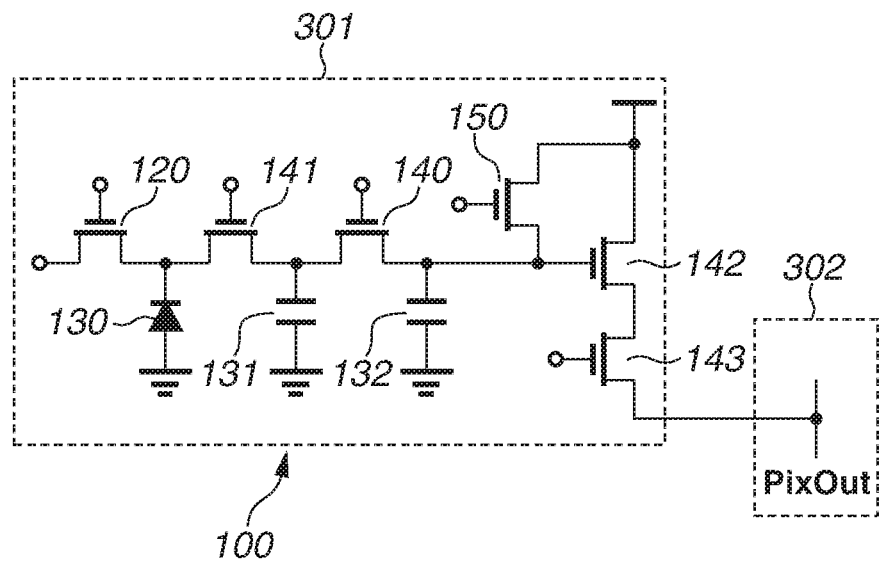

The division of the pixel circuit illustrated in FIG. 18 can be modified as illustrated in FIGS. 20A, 20B, and 20C. Like FIG. 18, FIGS. 20A, 20B, and 20C are diagrams illustrating a circuit configuration of a pixel 100 according to the present exemplary embodiment.

In the example of FIG. 20A, the photoelectric conversion unit 130 is arranged on the first semiconductor substrate 301. The discharging transistor 120, the transfer transistor 140, the GS transistor 141, and the reset transistor 150 are arranged on the first semiconductor substrate 301. The charge holding unit 131 is further arranged on the first semiconductor substrate 301. On the other hand, the amplification transistor 142 and the selection transistor 143 are arranged on the second semiconductor substrate 302.

In the example of FIG. 20B, the photoelectric conversion unit 130 is arranged on the first semiconductor substrate 301. The discharging transistor 120, the transfer transistor 140, the GS transistor 141, the reset transistor 150, and the amplification transistor 142 are arranged on the first semiconductor substrate 301. The charge holding unit 131 is further arranged on the first semiconductor substrate 301. On the other hand, the selection transistor 143 is arranged on the second semiconductor substrate 302.

In the example of FIG. 20C, the photoelectric conversion unit 130 is arranged on the first semiconductor substrate 301. All the elements included in the pixel 100 are also arranged on the first semiconductor substrate 301. On the other hand, the output wiring for outputting a signal from the pixel 100 is arranged on the second semiconductor substrate 302.

As described above, the pixels 100 according to the present exemplary embodiment include the charge holding units 131. Such a configuration enables a global electronic shutter in a charge domain. Like the first to fifth exemplary embodiments, the accuracy of the signals output from the photoelectric conversion apparatus can be improved.

Figure 21:
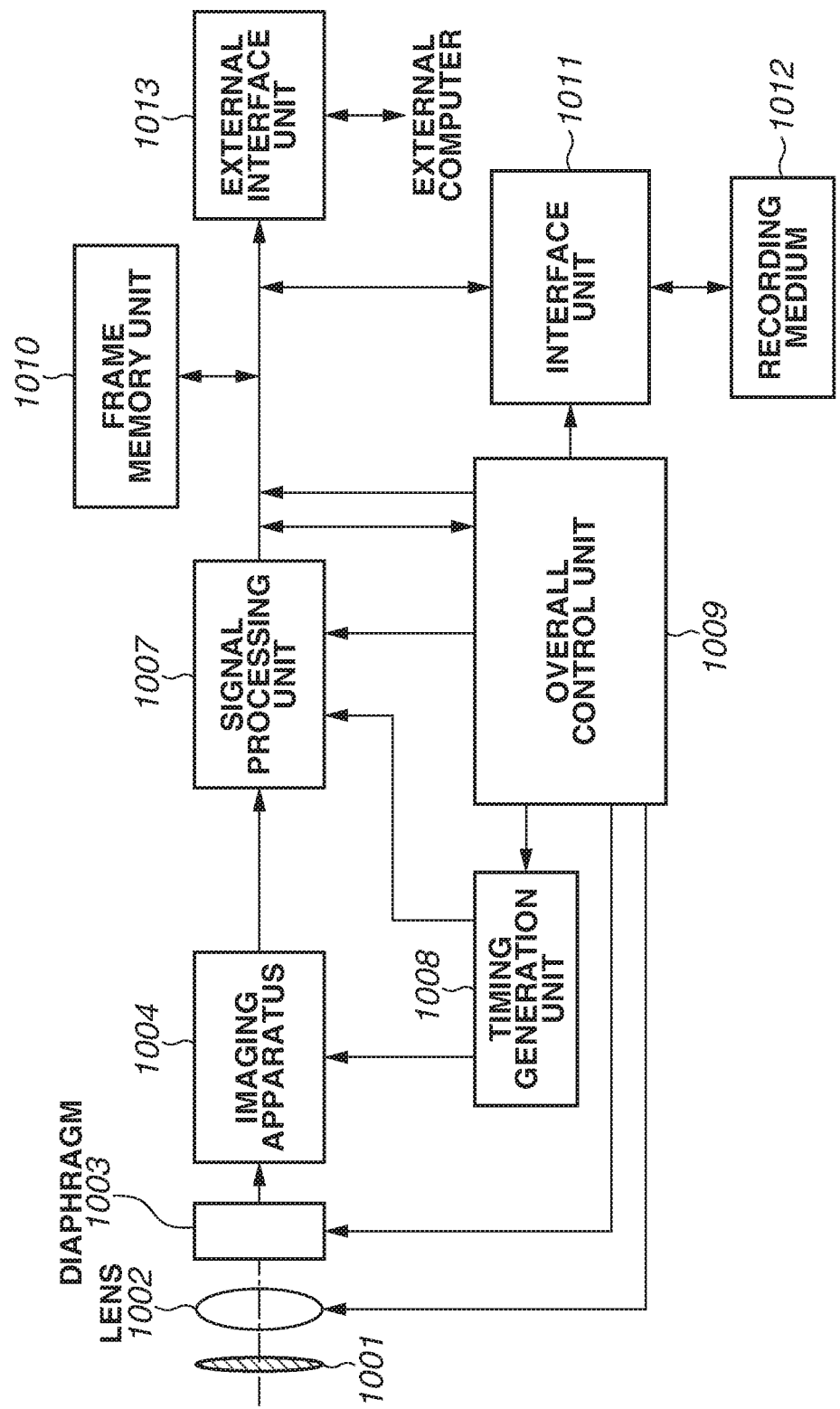
FIG. 21 is a block diagram schematically illustrating a configuration of an imaging system.

An exemplary embodiment (seventh exemplary embodiment) of an imaging system will be described. Examples of the imaging system include a digital still camera, a digital camcorder, a camera head, a copying machine, a facsimile, a mobile phone, a smartphone, a vehicle-mounted camera, and an observation satellite. FIG. 21 illustrates a block diagram of a digital still camera that is an example of the imaging system.

In FIG. 21, a barrier 1001 is intended for lens protection. A lens 1002 forms an optical image of an object on an imaging apparatus 1004. A diaphragm 1003 is intended to adjust the amount of light having passed through the lens 1002. Any one of the imaging apparatuses described in the foregoing first to sixth exemplary embodiments is used as the imaging apparatus 1004.

A signal processing unit 1007 performs processing such as correction and data compression on pixel signals output from the imaging apparatus 1004, and obtains an image signal. In FIG. 21, a timing generation unit 1008 outputs various timing signals to the imaging apparatus 1004 and the signal processing unit 1007. An overall control unit 1009 controls the entire digital still camera. A frame memory unit 1010 is intended to temporarily store image data. An interface unit 1011 is intended to perform recording or reading on a recording medium. A recording medium 1012 is a detachably attachable recording medium such as a semiconductor memory. The recording medium 1012 is intended for recording or reading of imaging data. An interface unit 1013 is intended to communicate with an external computer.

The imaging system can include at least the imaging apparatus 1004 and the signal processing unit 1007 that processes the pixel signals output from the imaging apparatus 1004. In such a case, the other components are arranged outside the imaging system.

As described above, in the exemplary embodiment of the imaging system, any one of the photoelectric conversion apparatuses according to the first to sixth exemplary embodiments is used as the imaging apparatus 1004. Such a configuration can improve the accuracy (image quality) of a signal output from the imaging system.

Figure 22A:
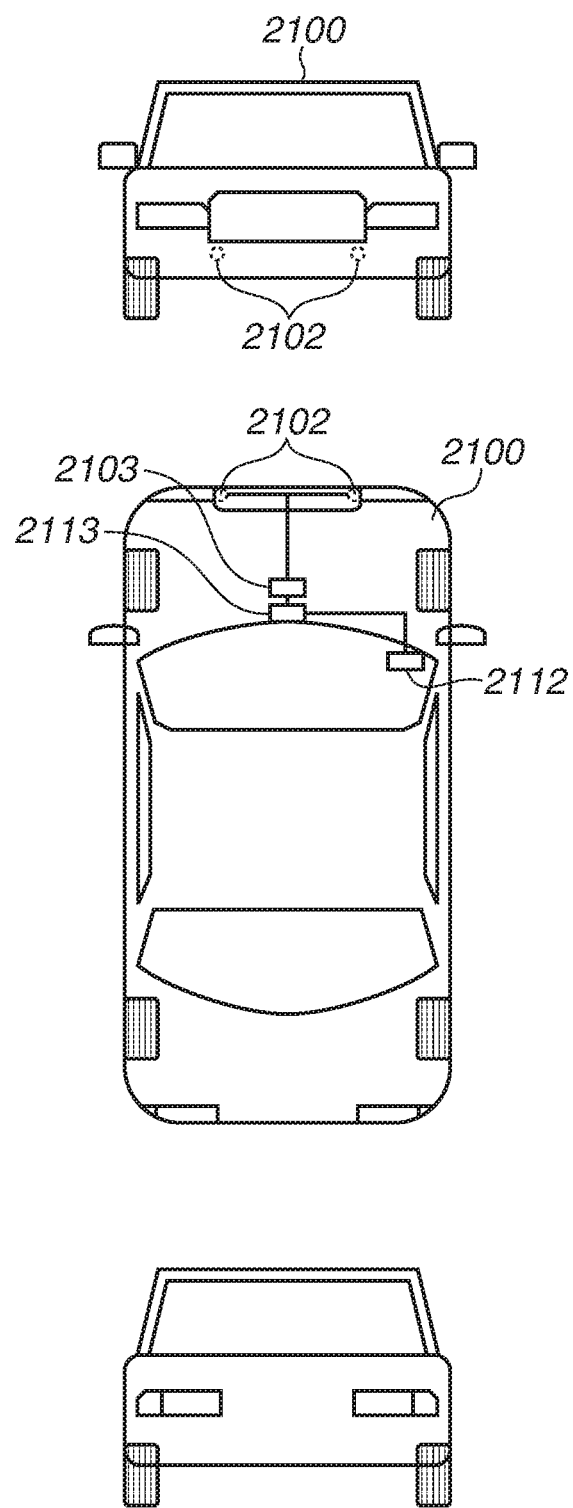
FIGS. 22A and 22B are block diagrams schematically illustrating a configuration of an automobile including a vehicle-mounted camera.

An exemplary embodiment (eighth exemplary embodiment) of a moving body will be described. The moving body according to the present exemplary embodiment is an automobile including a vehicle-mounted camera. FIG. 22A schematically illustrates an appearance and main internal structure of an automobile 2100. The automobile 2100 includes imaging apparatuses 2102, an imaging system integrated circuit (application specific integrated circuit (ASIC)) 2103, an alarm unit 2112, and a main control unit 2113.

Any of the imaging apparatuses described in the foregoing exemplary embodiments can be used as the imaging apparatuses 2102. The alarm unit 2112 warns the driver when an abnormality-indicating signal is received from an imaging system, a vehicle sensor, or a control unit. The main control unit 2113 controls operation of the imaging system, vehicle sensors, and control units in a centralized manner. The automobile 2100 does not need to include the main control unit 2113. In such a case, the imaging system, the vehicle sensors, and the control units include individual communication interfaces, and individually transmit and receive control signals via a communication network (for example, a Controller Area Network (CAN) standard).

Figure 22B:
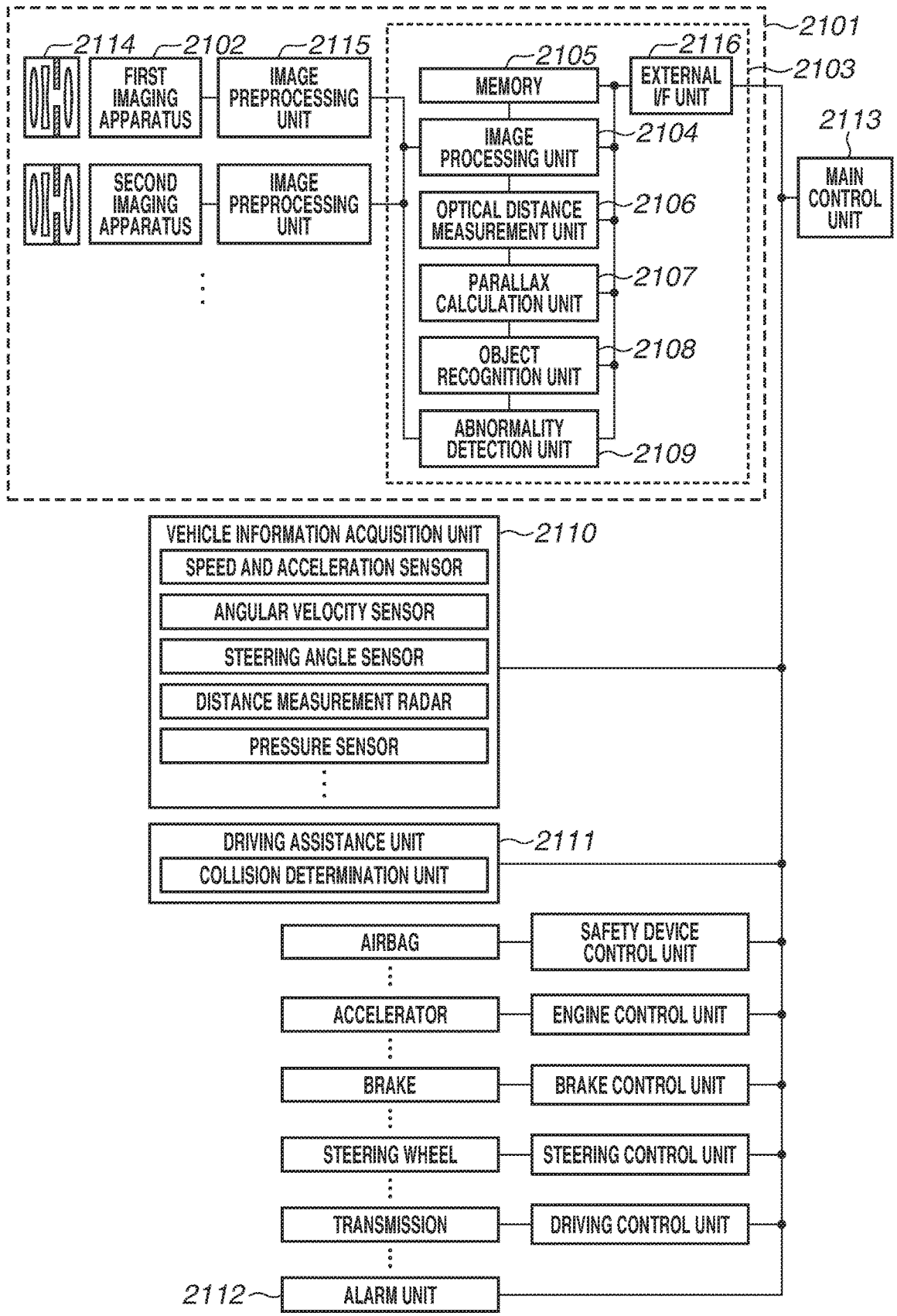

FIG. 22B is a block diagram illustrating a system configuration of the automobile 2100. The automobile 2100 includes a first imaging apparatus 2102 and a second imaging apparatus 2102. In other words, the vehicle-mounted camera according to the present exemplary embodiment is a stereo camera. Optical units 2114 form an object image on the respective imaging apparatuses 2102. Pixel signals output from the imaging apparatuses 2102 are processed by image preprocessing units 2115 and then transmitted to the imaging system integrated circuit 2103. The image preprocessing units 2115 perform processing such as signal-noise (S-N) calculation and addition of a synchronization signal.

The imaging system integrated circuit 2103 includes an image processing unit 2104, a memory 2105, an optical distance measurement unit 2106, a parallax calculation unit 2107, an object recognition unit 2108, an abnormality detection unit 2109, and an external interface (I/F) unit 2116. The image processing unit 2104 processes the pixel signals to generate image signals. The image processing unit 2104 also corrects the image signals and complements abnormal pixels. The memory 2105 temporarily stores the image signals. The memory 2105 may also store the positions of known abnormal pixels in the imaging apparatuses 2102. The optical distance measurement unit 2106 performs focusing or distance measurement on an object by using the image signals. The parallax calculation unit 2107 performs object collation (stereo matching) on parallax images. The object recognition unit 2108 analyzes the image signals and recognizes objects such as an automobile, a human, a sign, and a road. The abnormality detection unit 2109 detects a failure or malfunction of the imaging apparatuses 2102. If a failure or malfunction is detected, the abnormality detection unit 2109 transmits a signal indicating the detection of abnormality to the main control unit 2113. The external I/F unit 2116 mediates information exchange between the components of the imaging system integrated circuit 2103 and the main control unit 2113 or various control units.

The automobile 2100 includes a vehicle information acquisition unit 2110 and a driving assistance unit 2111. The vehicle information acquisition unit 2110 includes vehicle sensors such as a speed and acceleration sensor, an angular velocity sensor, a steering angle sensor, a distance measurement radar, and a pressure sensor.

The driving assistance unit 2111 includes a collision determination unit. The collision determination unit determines whether there is a possibility of collision with an object based on information from the optical distance measurement unit 2106, the parallax calculation unit 2107, and the object recognition unit 2108. The optical distance measurement unit 2106 and the parallax calculation unit 2107 are examples of a distance information acquisition unit that obtains distance information with respect to an object. The distance information refers to information about parallax, a defocus amount, and/or a distance to the object. The collision determination unit may determine the possibility of collision by using any of such pieces of distance information. The distance information acquisition unit may be implemented by hardware of dedicated design or by a software module.

In the example described above, the driving assistance unit 2111 controls the automobile 2100 not to collide with another object. However, the driving assistance unit 2111 may be applied to controls such as automatically driving the automobile 2100 to follow another vehicle and automatically driving the automobile 2100 not to depart from the lane.

The automobile 2100 further includes driving units used in running, such as an airbag, an accelerator, a brake, a steering wheel, and a transmission. The automobile 2100 also includes control units for such driving units. The control units control the corresponding driving units based on control signals from the main control unit 2113.

The imaging system used in the present exemplary embodiment is not limited to an automobile and is applicable to a moving body (moving apparatus) such as a ship, an aircraft, or an industrial robot. The imaging system is not limited to a moving body and is widely applicable to apparatuses that use object recognition. Examples include an intelligent transportation system (ITS).

As described above, in the exemplary embodiment of the automobile, any one of the photoelectric conversion apparatuses according to the first to sixth exemplary embodiments is used as the imaging apparatuses 2102. Such a configuration can improve the accuracy (image quality) of the signals output from the imaging apparatuses in the moving body including the imaging apparatuses.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2018-022401, filed Feb. 9, 2018, which is hereby incorporated by reference herein in its entirety.

What is claimed is:

1. A photoelectric conversion apparatus comprising:
a plurality of pixels each including a photoelectric conversion unit, a transistor configured to process a signal charge generated in the photoelectric conversion unit, and a differential pair included in an analog-to-digital conversion circuit, the transistor and the differential pair sharing a common node;
a first semiconductor substrate on which the photoelectric conversion units and the transistors of the plurality of pixels are two-dimensionally arranged;
a second semiconductor substrate on which a plurality of circuit blocks is two-dimensionally arranged;
a bonding portion configured to electrically connect the first semiconductor substrate and the second semiconductor substrate;
a wiring arranged between the first semiconductor substrate and the bonding portion, the wiring being connected to the transistors of the plurality of pixels and configured to supply a control signal to the transistors of the plurality of pixels;
a first scanning circuit arranged on the first semiconductor substrate; and
a second scanning circuit arranged on the second semiconductor substrate,
wherein the first scanning circuit and the second scanning circuit are connected to the wiring.

2. The photoelectric conversion apparatus according to claim 1, wherein each of the plurality of circuit blocks includes at least part of the analog-to-digital circuit of a corresponding one of the plurality of pixels.

3. The photoelectric conversion apparatus according to claim 1, wherein each of the plurality of circuit blocks includes a memory circuit configured to store a digital signal output from the analog-to-digital conversion circuit of a corresponding one of the plurality of pixels.

4. The photoelectric conversion apparatus according to claim 1, wherein each of the plurality of pixels includes a second transistor configured to process the signal charge, and
wherein the photoelectric conversion apparatus further comprises a second wiring arranged between the first semiconductor substrate and the bonding portion, the second wiring being connected to the second transistors of the plurality of pixels and configured to supply a control signal to the second transistors of the plurality of pixels.

5. A photoelectric conversion apparatus comprising:
a plurality of pixels each including a photoelectric conversion unit, a transistor configured to process a signal charge generated in the photoelectric conversion unit, and
a differential pair included in an analog-to-digital conversion circuit, the transistor and the differential pair sharing a common node;
a first semiconductor substrate on which the photoelectric conversion units and the transistors of the plurality of pixels are two-dimensionally arranged;
a second semiconductor substrate on which a plurality of circuit blocks is two-dimensionally arranged;
a plurality of bonding portions configured to electrically connect the first semiconductor substrate and the second semiconductor substrate;
a wiring arranged between the first or second semiconductor substrate and the bonding portion, the wiring being connected to the transistors of the plurality of pixels and configured to supply a control signal to the transistors of the plurality of pixels;
a first scanning circuit connected to the wiring and arranged on the first semiconductor substrate; and
a second scanning circuit connected to the wiring and arranged on the second semiconductor substrate,
wherein each of the plurality of bonding portions electrically connects a corresponding one of the plurality of circuit blocks and the transistor of a corresponding one of the plurality of pixels.

6. The photoelectric conversion apparatus according to claim 5, wherein the plurality of circuit blocks each includes a timing control circuit configured to delay a control signal supplied to the transistor and transmit a delayed control signal obtained by delaying the control signal supplied to the transistor.

7. The photoelectric conversion apparatus according to claim 5, wherein each of the plurality of circuit blocks includes at least part of the analog-to-digital conversion circuit of a corresponding one of the plurality of pixels.

8. The photoelectric conversion apparatus according to claim 5, wherein each of the plurality of circuit blocks includes a memory circuit configured to store a digital signal output from the analog-to-digital conversion circuit of a corresponding one of the plurality of pixels.

9. A photoelectric conversion apparatus comprising:
a plurality of pixels each including a photoelectric conversion unit, a charge holding unit configured to hold a signal charge generated in the photoelectric conversion unit, an amplification transistor configured to output a signal based on the signal charge transferred from the charge holding unit, and an overflow transistor configured to discharge the signal charge to an overflow drain;
a first semiconductor substrate on which a first portion of each of the plurality of pixels is arranged;
a second semiconductor substrates on which a second portion of each of the plurality of pixels is arranged;
a plurality of bonding portions configured to electrically connect the first semiconductor substrate and the second semiconductor substrate;
a wiring arranged between the first semiconductor substrate and the bonding portions, the wiring being connected to the overflow transistors of the plurality of pixels and configured to supply a control signal to the overflow transistors of the plurality of pixels;
a first scanning circuit connected to the wiring and arranged on the first semiconductor substrate; and
a second scanning circuit arranged on the second semiconductor substrate,
wherein the first scanning circuit and the second scanning circuit are connected to the wiring.

10. The photoelectric conversion apparatus according to claim 9,
wherein the transistors configured to process the signal charge of each of the plurality of pixels include a first transistor configured to transfer the signal charge in the photoelectric conversion unit to the charge holding unit and a second transistor configured to transfer the signal charge in the charge holding unit to an input node of the amplification transistor, and wherein the wiring is connected to the first transistors of the plurality of pixels.

11. The photoelectric conversion apparatus according to claim 9,
wherein the transistor configured to process the signal charge of each of the plurality of pixels includes a discharging transistor configured to discharge the signal charge of the photoelectric conversion unit, and
wherein the wiring is connected to the discharging transistors of the plurality of pixels.

12. An imaging system comprising:
the photoelectric conversion apparatus according to claim 1; and
a processing apparatus configured to process a signal output from the photoelectric conversion apparatus to obtain an image signal.

13. A moving body comprising:
the photoelectric conversion apparatus according to claim 1;
a processing apparatus configured to perform processing on a signal output from the photoelectric conversion apparatus; and
a control unit configured to control the moving body based on a result of the processing.

14. An imaging system comprising:
the photoelectric conversion apparatus according to claim 5; and
a processing apparatus configured to process a signal output from the photoelectric conversion apparatus to obtain an image signal.

15. A moving body comprising:
the photoelectric conversion apparatus according to claim 5;
a processing apparatus configured to perform processing on a signal output from the photoelectric conversion apparatus; and
a control unit configured to control the moving body based on a result of the processing.

16. An imaging system comprising:
the photoelectric conversion apparatus according to claim 9; and
a processing apparatus configured to process a signal output from the photoelectric conversion apparatus to obtain an image signal.

17. A moving body comprising:
the photoelectric conversion apparatus according to claim 9;
a processing apparatus configured to perform processing on a signal output from the photoelectric conversion apparatus; and
a control unit configured to control the moving body based on a result of the processing.

18. The photoelectric conversion apparatus according to claim 1, wherein the bonding portion includes two conductive members which are included in different wiring layers and bonded to each other.

19. The photoelectric conversion apparatus according to claim 5, wherein each of the plurality of bonding portions includes two conductive members which are included in different wiring layers and bonded to each other.

20. The photoelectric conversion apparatus according to claim 9, wherein each of the plurality of bonding portions includes two conductive members which are included in different wiring layers and bonded to each other.

21. The photoelectric conversion apparatus according to claim 1, wherein
each of the plurality of pixels has two transistors as a part of the differential pair,
sources of the two transistors are connected to a common current source, and
one of gates of the two transistors receives a signal based on the signal charge generated in the photoelectric conversion unit.

22. The photoelectric conversion apparatus according to claim 5, wherein
each of the plurality of pixels has two transistors as a part of the differential pair,
sources of the two transistors are connected to a common current source, and
one of gates of the two transistors receives a signal based on the signal charge generated in the photoelectric conversion unit.

23. A photoelectric conversion apparatus comprising:
a plurality of pixels each including a photoelectric conversion unit, a charge holding unit configured to hold a signal charge generated in the photoelectric conversion unit, an amplification transistor configured to output a signal based on the signal charge transferred from the charge holding unit, and a transfer transistor configured to transfer the signal charge to the charge holding unit;
a first semiconductor substrate on which a first portion of each of the plurality of pixels is arranged;
a second semiconductor substrates on which a second portion of each of the plurality of pixels is arranged;
a plurality of bonding portions configured to electrically connect the first semiconductor substrate and the second semiconductor substrate;
a wiring arranged between the first semiconductor substrate and the bonding portions, the wiring being connected to the transfer transistors of the plurality of pixels and configured to supply a control signal to the transfer transistors of the plurality of pixels;
a first scanning circuit connected to the wiring and arranged on the first semiconductor substrate; and
a second scanning circuit arranged on the second semiconductor substrate,
wherein the first scanning circuit and the second scanning circuit are connected to the wiring.

24. A photoelectric conversion apparatus comprising:
a plurality of pixels each including a photoelectric conversion unit, a transistor configured to process a signal charge generated in the photoelectric conversion unit, and a differential pair included in an analog-to-digital conversion circuit, the transistor and the differential pair sharing a common node;
a first semiconductor substrate on which the photoelectric conversion units and the transistors of the plurality of pixels are two-dimensionally arranged;
a second semiconductor substrate on which a plurality of circuit blocks is two-dimensionally arranged;
a bonding portion configured to electrically connect the first semiconductor substrate and the second semiconductor substrate;
a wiring arranged between the first semiconductor substrate and the bonding portion, the wiring being connected to the transistors constituting the differential pair and configured to supply a ramp signal to the transistors constituting the differential pair;
a first scanning circuit arranged on the first semiconductor substrate; and a second scanning circuit arranged on the second semiconductor substrate, wherein the first scanning circuit and the second scanning circuit are connected to the wiring.

25. The photoelectric conversion apparatus according to claim 1, wherein the first scanning circuit controls the transistors of the pixel.

26. The photoelectric conversion apparatus according to claim 1, wherein both the first scanning circuit and the second scanning circuit control the transistors of the pixel.

27. An imaging system comprising:
the photoelectric conversion apparatus according to claim 24; and
a processing apparatus configured to process a signal output from the photoelectric conversion apparatus to obtain an image signal.

28. A moving body comprising:
the photoelectric conversion apparatus according to claim 24;
a processing apparatus configured to perform processing on a signal output from the photoelectric conversion apparatus; and
a control unit configured to control the moving body based on a result of the processing.

* * * * *